US012796203B2

(12) United States Patent
Kim et al.

(10) Patent No.: US 12,796,203 B2
(45) Date of Patent: Nov. 10, 2026

(54) DISPLAY DEVICE AND METHOD FOR MANUFACTURING THE SAME

(71) Applicant: Samsung Display Co., LTD., Yongin-si (KR)

(72) Inventors: Sang Jo Kim, Yongin-si (KR); Hoo Keun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 531 days.

(21) Appl. No.: 18/233,264

(22) Filed: Aug. 11, 2023

(65) Prior Publication Data

US 2024/0063250 A1 Feb. 22, 2024

(30) Foreign Application Priority Data

Aug. 16, 2022 (KR) ........................ 10-2022-0102081

(51) Int. Cl.
*H10W 72/30* (2026.01)
*H10H 29/14* (2025.01)
(Continued)

(52) U.S. Cl.
CPC .......... *H10H 29/142* (2025.01); *H10W 72/30* (2026.01); *H10W 90/00* (2026.01);
(Continued)

(58) Field of Classification Search
CPC .. H10H 29/142; H10H 20/812; H10H 20/018; H10H 20/8215; H10H 20/825; H10H 20/857; H10H 20/01335; H10H 20/84; H10H 20/032; H10H 20/036; H10H 20/813; H10H 20/83; H01L 24/05; H01L 24/13; H01L 24/16; H01L 24/29; H01L 24/32; H01L 24/73; H01L 25/18; H01L 2224/05555; H01L 2224/05573; H01L 2224/13023; H01L 2224/16145; H01L 2224/29111; H01L 2224/29124; H01L 2224/29139; H01L 2224/29147; H01L 2224/29166; H01L 2224/73253;
(Continued)

(56) References Cited

U.S. PATENT DOCUMENTS 11,121,171 B2 9/2021 Choi et al.
11,677,042 B2 6/2023 Broell et al.
(Continued)

FOREIGN PATENT DOCUMENTS

KR 2007-0047058 A 5/2007
KR 10-2020-0062863 A 6/2020
(Continued)

*Primary Examiner* — Elias Ullah
(74) *Attorney, Agent, or Firm* — Womble Bond Dickinson (US) LLP

(57) ABSTRACT

A display device includes a substrate, a plurality of pixel electrodes on the substrate, a plurality of light emitting elements on the plurality of pixel electrodes, and each of the plurality of light emitting elements including a first semiconductor layer, an active layer, and a second semiconductor layer, and a barrier layer around the plurality of light emitting elements and partitioning the plurality of light emitting elements, wherein the barrier layer includes a semiconductor material and a dopant including iron or carbon.

17 Claims, 35 Drawing Sheets

(51) Int. Cl.
*H10W 90/00* (2026.01)
*H10W 72/00* (2026.01)
*H10W 72/20* (2026.01)
*H10W 72/90* (2026.01)

(52) U.S. Cl.
CPC ........ *H10W 72/242* (2026.01); *H10W 72/352* (2026.01); *H10W 72/877* (2026.01); *H10W 72/90* (2026.01); *H10W 72/932* (2026.01); *H10W 90/722* (2026.01)

(58) Field of Classification Search
CPC ... H01L 2924/0132; H01L 2924/12041; H01L 25/167; H01L 25/0753; H10K 59/126; H10K 59/1201; H10K 59/352; H10K 71/00
See application file for complete search history.

(56) References Cited

U.S. PATENT DOCUMENTS

| | | | | |
|---|---|---|---|---|
| 11,705,479 | B2 | 7/2023 | Choi et al. | |
| 2020/0152694 | A1* | 5/2020 | Lee | H10H 20/855 |
| 2020/0328327 | A1 | 10/2020 | He et al. | |
| 2022/0139987 | A1 | 5/2022 | Saito et al. | |
| 2023/0307577 | A1 | 9/2023 | Lee et al. | |

FOREIGN PATENT DOCUMENTS

| | | | |
|---|---|---|---|
| KR | 10-2021-0144751 | A | 11/2021 |
| KR | 10-2021-0149290 | A | 12/2021 |

* cited by examiner

DISPLAY DEVICE AND METHOD FOR MANUFACTURING THE SAME

CROSS-REFERENCE TO RELATED APPLICATION

This application claims priority to Korean Patent Application No. 10-2022-0102081 filed on Aug. 16, 2022 in the Korean Intellectual Property Office, the entire disclosure of which is incorporated by reference herein.

BACKGROUND

1. Technical Field

The present disclosure relates to a display device and a method for manufacturing the same.

2. Description of the Related Art

As the information society develops, the demand for display devices for displaying images has increased and diversified. The display device may be a flat panel display such as a liquid crystal display (LCD), a field emission display (FED), or a light emitting display (LED). Light emitting display devices may include an organic light emitting display device including an organic light emitting diode element as a light emitting element, an inorganic light emitting display device including an inorganic semiconductor element as a light emitting element, or a micro light emitting diode display device including a micro light emitting diode element as a light emitting element.

Recently, head mounted displays (HMDs) including the light emitting display devices have been developed. The head mounted display (HMD) is a spectacle-type monitor device for virtual reality (VR) or augmented reality (AR) that is worn in the form of glasses or a helmet by a user and forms a focus at a distance close to user's eyes in front of the user's eyes.

A high-resolution micro light emitting diode display panel including a micro light emitting diode element is applied to the head mounted display. Because the micro light emitting diode element emits light of a single color, the micro light emitting diode display panel may include a wavelength conversion layer converting a wavelength of light emitted from the micro light emitting diode element in order to display various colors.

SUMMARY

Aspects and features of embodiments of the present disclosure provide a display device capable of improving light emission efficiency.

However, aspects and features of embodiments of the present disclosure are not restricted to those set forth herein. The above and other aspects and features of embodiments of the present disclosure will become more apparent to one of ordinary skill in the art to which the present disclosure pertains by referencing the detailed description of the present disclosure given below.

According to one or more embodiments of the present disclosure, a display device includes a substrate, a plurality of pixel electrodes on the substrate, a plurality of light emitting elements on the plurality of pixel electrodes, each of the plurality of light emitting elements including a first semiconductor layer, an active layer, and a second semiconductor layer, and a barrier layer around the plurality of light emitting elements and partitioning the plurality of light emitting elements, wherein the barrier layer includes a semiconductor material and a dopant including iron or carbon.

In one or more embodiments, semiconductor material of the barrier layer includes AlGaInN, GaN, AlGaN, InGaN, AlN, or InN.

In one or more embodiments, a doping concentration of the dopant is in a range of $1\times10^{17}$ to $1\times10^{20}/cm^3$.

In one or more embodiments, the second semiconductor layer is a common layer continuously on the plurality of light emitting elements.

In one or more embodiments, the barrier layer is on a second semiconductor region not overlapping the first semiconductor layer and the active layer.

In one or more embodiments, a length of the barrier layer is between 0.1 μm to 10 μm.

In one or more embodiment, one surface of the barrier layer aligns and coincides with one surface of the first semiconductor layer.

In one or more embodiments, the barrier layer is in contact with a portion of the second semiconductor layer, the first semiconductor layer, and a side surface of the active layer of each of the plurality of light emitting elements.

In one or more embodiments, the plurality of light emitting elements includes a first light emitting element configured to emit light of a blue wavelength band, a second light emitting element configured to emit light of a green wavelength band, and a third light emitting element configured to emit light of a red wavelength band.

In one or more embodiments, the active layer of the first light emitting element, the active layer of the second light emitting element, and the active layer of the third light emitting element include different amount of indium doped into a semiconductor material.

In one or more embodiments, a diameter of the first light emitting element is smaller than a diameter of the second light emitting element and the diameter of the second light emitting element is smaller than a diameter of the third light emitting element.

According to one or more embodiments of the present disclosure, a method of a display device, the method comprise forming a third semiconductor layer and a second semiconductor layer on a target substrate, forming a first insulating member on the second semiconductor layer and forming a barrier layer from the second semiconductor layer, forming a plurality of openings by removing the first insulating layer using a hard mask, forming light emitting elements in the plurality of openings, and bonding the light emitting elements to a semiconductor circuit board, wherein the barrier layer is grown from the second semiconductor layer and is formed by doping iron or carbon as a dopant.

In one or more embodiments, the barrier layer is grown as the second semiconductor layer acts as seed, and the dopant is applied by flowing a reactive gas containing iron or carbon.

In one or more embodiments, a doping concentration of the dopant is formed in a range of $1\times10^{17}/cm^3$ to $1\times10^{20}/cm^3$.

In one or more embodiments, the barrier layer has a same length as the first insulating layer.

In one or more embodiments, the forming of the light emitting elements includes forming a second insulating member having a first opening from among the plurality of openings exposed, forming a first light emitting element in the first opening, forming a third insulating member having a second opening from among the plurality of openings exposed, forming a second light emitting element in the second opening, forming a fourth insulating member having a third opening from among the plurality of openings exposed, forming a third light emitting element in the third opening, and removing the second insulating member, the third insulating member, and the fourth insulating member.

In one or more embodiments, the method further includes forming a connection electrode on the light emitting elements after forming the light emitting elements.

In one or more embodiments, the light emitting elements are bonded to the semiconductor circuit board by a fusion bonding of a pixel electrode formed on the semiconductor circuit board and the connection electrodes.

In one or more embodiments, the method further includes removing the target substrate and the third semiconductor layer after bonding the light emitting elements to the semiconductor circuit board, wherein the target substrate and the third semiconductor layer are removed by using a laser lift off, polishing or etching process.

According to one or more embodiments of the present disclosure, a display device includes a substrate, a plurality of pixel electrodes on the substrate, a plurality of light emitting elements on the plurality of pixel electrodes, each of the plurality of light emitting elements including a first semiconductor layer, an active layer, and a second semiconductor layer, and a barrier layer around the plurality of light emitting elements and partitioning the plurality of light emitting elements, wherein the barrier layer includes a semiconductor material same as a semiconductor material of the second semiconductor layer, the semiconductor material of the barrier layer having a different dopant from the semiconductor material of the second semiconductor layer, and wherein the dopant includes iron or carbon.

According to the display device and the method for manufacturing the same according to the embodiments, it is possible to prevent a decrease in light emission efficiency due to a lattice constant between a light emitting element and a barrier layer by growing the barrier layer from a second semiconductor layer.

In addition, each emission area can be partitioned without damage to the light emitting element by doping the barrier layer with iron or carbon to form an insulator.

In addition, it is possible to prevent the dopant from lowering the light emission efficiency of the light emitting element by doping the barrier layer with iron or carbon as a dopant to form an insulator.

However, the effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present disclosure will now be described more fully hereinafter with reference to the accompanying drawings, in which embodiments of the present disclosure are shown. The present disclosure may, however, be embodied in different forms and should not be construed as limited to embodiments set forth herein. Rather, these embodiments are provided so that the present disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments will be described with reference to the accompanying drawings.

Figure 1:
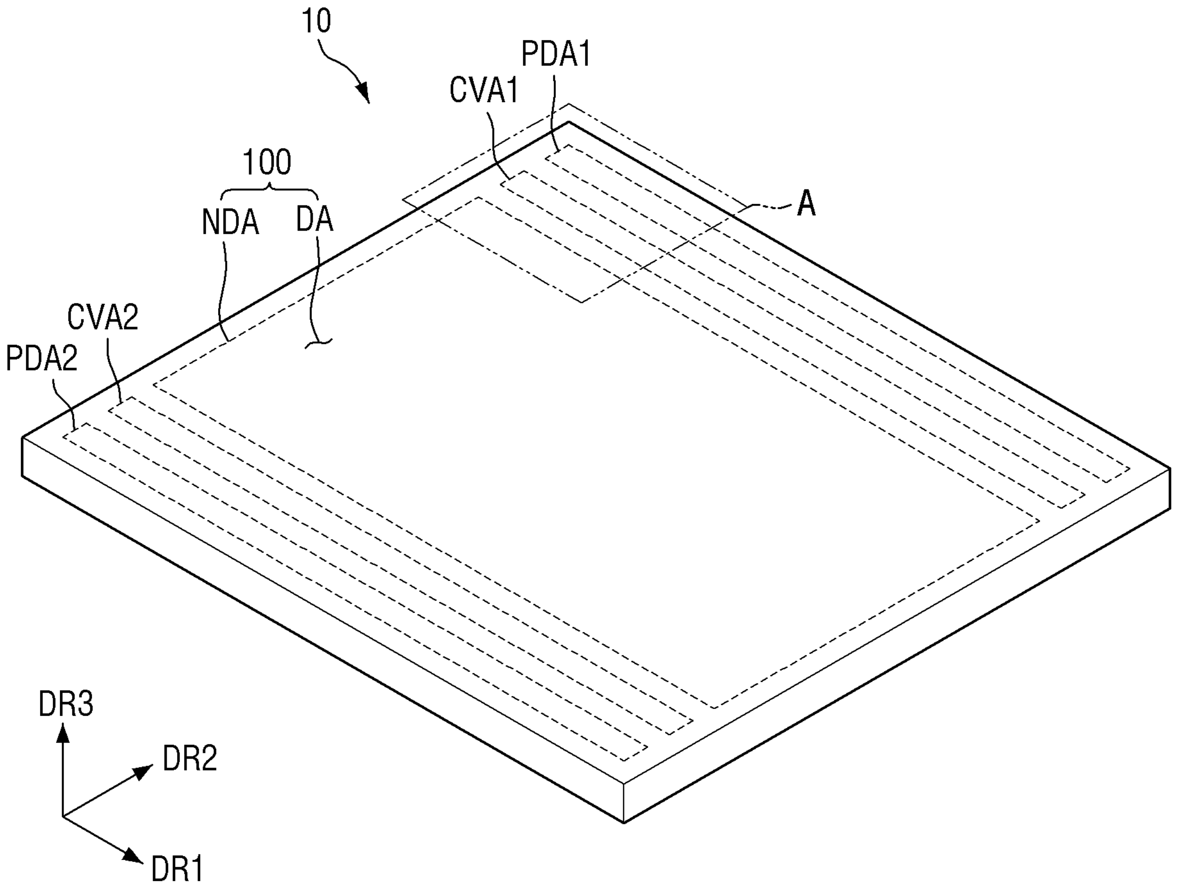
FIG. 1 is a layout diagram illustrating a display device according to one or more embodiments.
Figure 2:
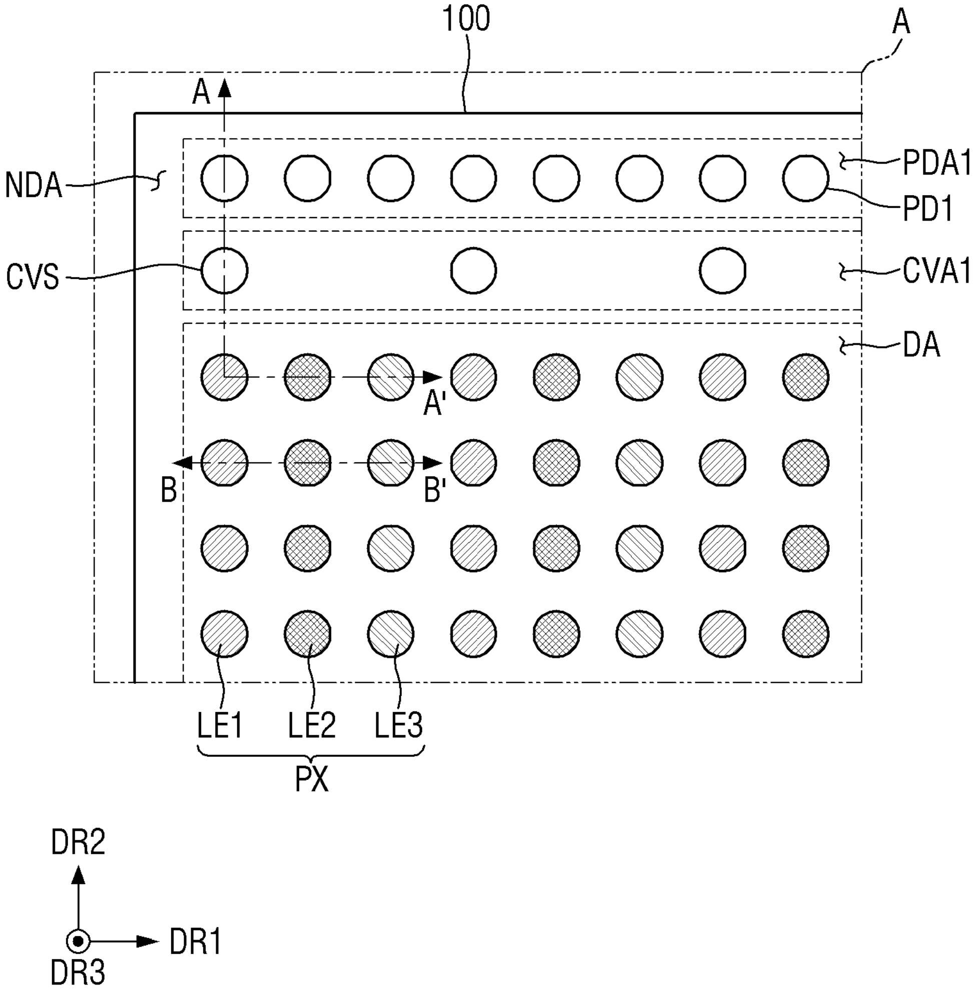
FIG. 2 is a layout diagram illustrating a region A of FIG. 1 in detail.
Figure 3:
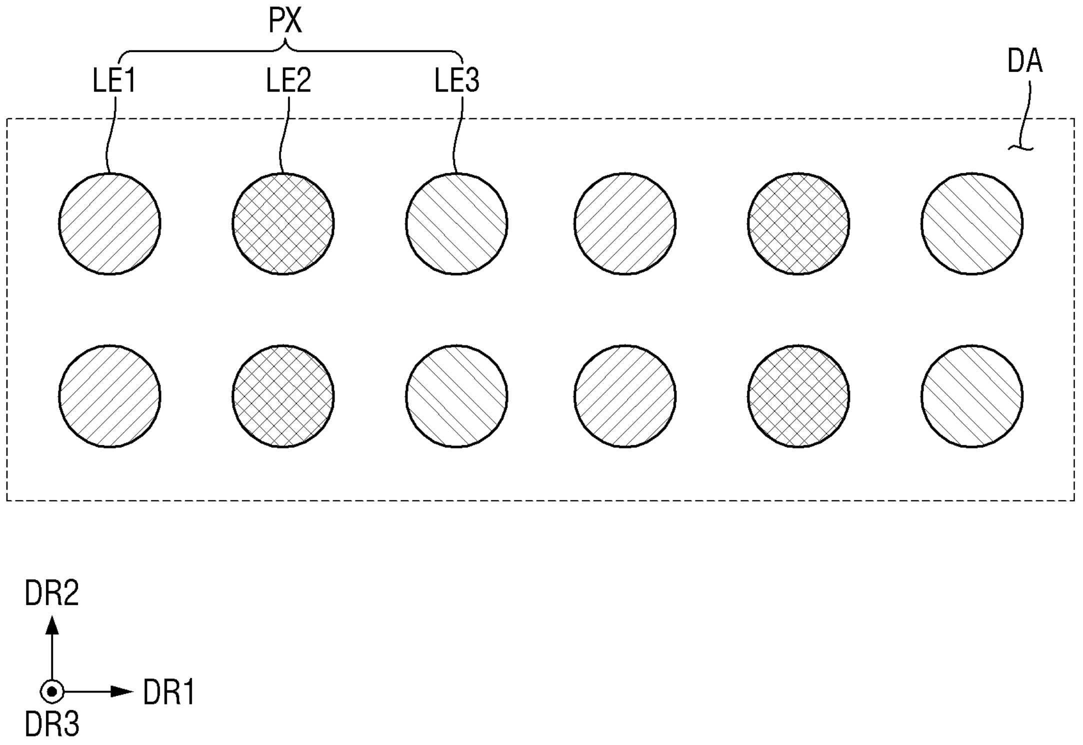
FIG. 3 is a layout diagram illustrating pixels of a display panel according to one or more embodiments.

FIG. 1 is a layout diagram illustrating a display device according to one or more embodiments. FIG. 2 is a layout diagram illustrating a region A of FIG. 1 in detail. FIG. 3 is a layout diagram illustrating pixels of a display panel according to one or more embodiments.

In FIGS. 1 to 3, the display device according to one or more embodiments is mainly described as being an ultra-small light emitting diode display device (micro or nano light emitting diode display device) including an ultra-small light emitting diode (micro or nano light emitting diode) as a light emitting element, but embodiments of the present disclosure are not limited thereto.

In addition, in FIGS. 1 to 3, the display device according to one or more embodiments is mainly described as being a light emitting diode on silicon (LEDoS) in which light emitting diodes are disposed as light emitting elements on a semiconductor circuit substrate 110 formed by a semiconductor process using a silicon wafer, but it should be noted that embodiments of the present disclosure are not limited thereto.

In addition, in FIGS. 1 to 3, a first direction DR1 indicates a horizontal direction of a display panel 100, a second direction DR2 indicates a vertical direction of the display panel 100, and a third direction DR3 indicates a thickness direction of the display panel 100 or a thickness direction of the semiconductor circuit substrate 110. In this case, "left", "right", "upper" and "lower" indicate directions when the display panel 100 is viewed from above. For example, "right side" indicates one side of the first direction DR1, "left side" indicates the other side of the first direction DR1, "upper side" indicates one side of the second direction DR2, and "lower side" indicates the other side of the second direction DR2. In addition, an "upper portion" refers to one side in the third direction DR3, and a "lower portion" refers to the other side in the third direction DR3.

Referring to FIGS. 1 to 3, a display device 10 according to one or more embodiments includes the display panel 100 including a display area DA and a non-display area NDA along an edge or periphery of the display area DA.

The display panel 100 may have a quadrilateral planar shape having long sides in the first direction DR1 and short sides in the second direction DR2. However, the planar shape of the display panel 100 is not limited thereto, and may have a polygonal shape other than a quadrilateral shape, a circular shape, an elliptical shape, or an irregular planar shape.

The display area DA may be an area in which an image is displayed, and the non-display area NDA may be an area in which no image is displayed. The planar shape of the display area DA may follow the planar shape of the display panel 100. FIG. 1 illustrates that the planar shape of the display area DA is a quadrilateral shape. The display area DA may be disposed in a central area of the display panel 100. The non-display area NDA may be disposed around the display area DA along an edge or periphery of the display area DA. The non-display area NDA may be disposed to surround the display area DA.

The display area DA of the display panel 100 may include a plurality of pixels PX. The pixel PX may be defined as a minimum light emitting unit capable of displaying white light.

Each of the plurality of pixels PX may include first to third light emitting elements LE1, LE2, and LE3 emitting light. According to one or more embodiments of the present disclosure each of the plurality of pixels PX includes three light emitting elements LE1, LE2, and LE3, but the present disclosure is not limited thereto. In addition, according to one or more embodiments of the present disclosure, each of the first to third light emitting elements LE1, LE2, and LE3 has a circular planar shape, but embodiments of the present disclosure is not limited thereto.

The first light emitting element LE1 may emit a first light. The first light may be light of a blue wavelength band. For example, the main peak wavelength (B-peak) of the first light may be positioned at approximately 370 nm to 460 nm, but embodiments of the present disclosure are not limited thereto.

The second light emitting element LE2 may emit a second light. The second light may be light of a green wavelength band. For example, the main peak wavelength (G-peak) of the second light may be positioned in approximately 480 nm to 560 nm, but embodiments of the present disclosure are not limited thereto.

The third light emitting element LE3 may emit the first light. The first light may be light of a blue wavelength band. For example, the main peak wavelength (B-peak) of the third light may be positioned in approximately 370 nm to 460 nm, but embodiments of the present disclosure are not limited thereto. In the present embodiment, the third light emitting element LE3 emits the first light, but may be converted into a third light by a wavelength conversion layer and/or a color filter, which will be described later. The third light may be light of a red wavelength band. The red wavelength band may be approximately 600 nm to 750 nm.

The first light emitting elements LE1, the second light emitting elements LE2, and the third light emitting elements LE3 may be alternately arranged along a first direction DR1. For example, the first light emitting elements LE1, the second light emitting elements LE2, and the third light emitting elements LE3 may be disposed in the order of the first light emitting element LE1, the second light emitting element LE2, and the third light emitting element LE3 in the first direction DR1. The first light emitting elements LE1 may be arranged along the second direction DR2. The second light emitting elements LE2 may be arranged along the second direction DR2. The third light emitting elements LE3 may be arranged along the second direction DR2.

The non-display area NDA may include a first common voltage supply area CVA1, a second common voltage supply area CVA2, a first pad portion PDA1, and a second pad portion PDA2.

The first common voltage supply area CVA1 may be disposed between the first pad portion PDA1 and the display area DA. The second common voltage supply area CVA2 may be disposed between the second pad portion PDA2 and the display area DA. Each of the first common voltage supply area CVA1 and the second common voltage supply area CVA2 may include a plurality of common voltage supply units CVS connected to a common electrode. The common voltage may be supplied to the common electrode through the plurality of common voltage supply units CVS.

The plurality of common voltage supply units CVS of the first common voltage supply area CVA1 may be electrically connected to any one of the first pads PD1 of the first pad portion PDA1. That is, the plurality of common voltage supply units CVS of the first common voltage supply area CVA1 may be supplied with a common voltage from any one of the first pads PD1 of the first pad portion PDA1.

The plurality of common voltage supply units CVS of the second common voltage supply area CVA2 may be electrically connected to any one of the second pads of the second pad portion PDA2. That is, the plurality of common voltage supply units CVS of the second common voltage supply area CVA2 may be supplied with a common voltage from any one of the second pads of the second pad portion PDA2.

Although the common voltage supply areas CVA1 and CVA2 are disposed on both sides of the display area DA in FIGS. 1 and 2, embodiments of the present disclosure are not limited thereto. For example, the common voltage supply areas CVA1 and CVA2 may be disposed to surround the display area DA.

The first pad portion PDA1 may be disposed on the upper side of the display panel 100. The first pad portion PDA1 may include first pads PD1 connected to an external circuit board.

The second pad portion PDA2 may be disposed on the lower side of the display panel 100. The second pad portion PDA2 may include second pads to be connected to an external circuit board. The second pad portion PDA2 may be omitted.

Figure 4:
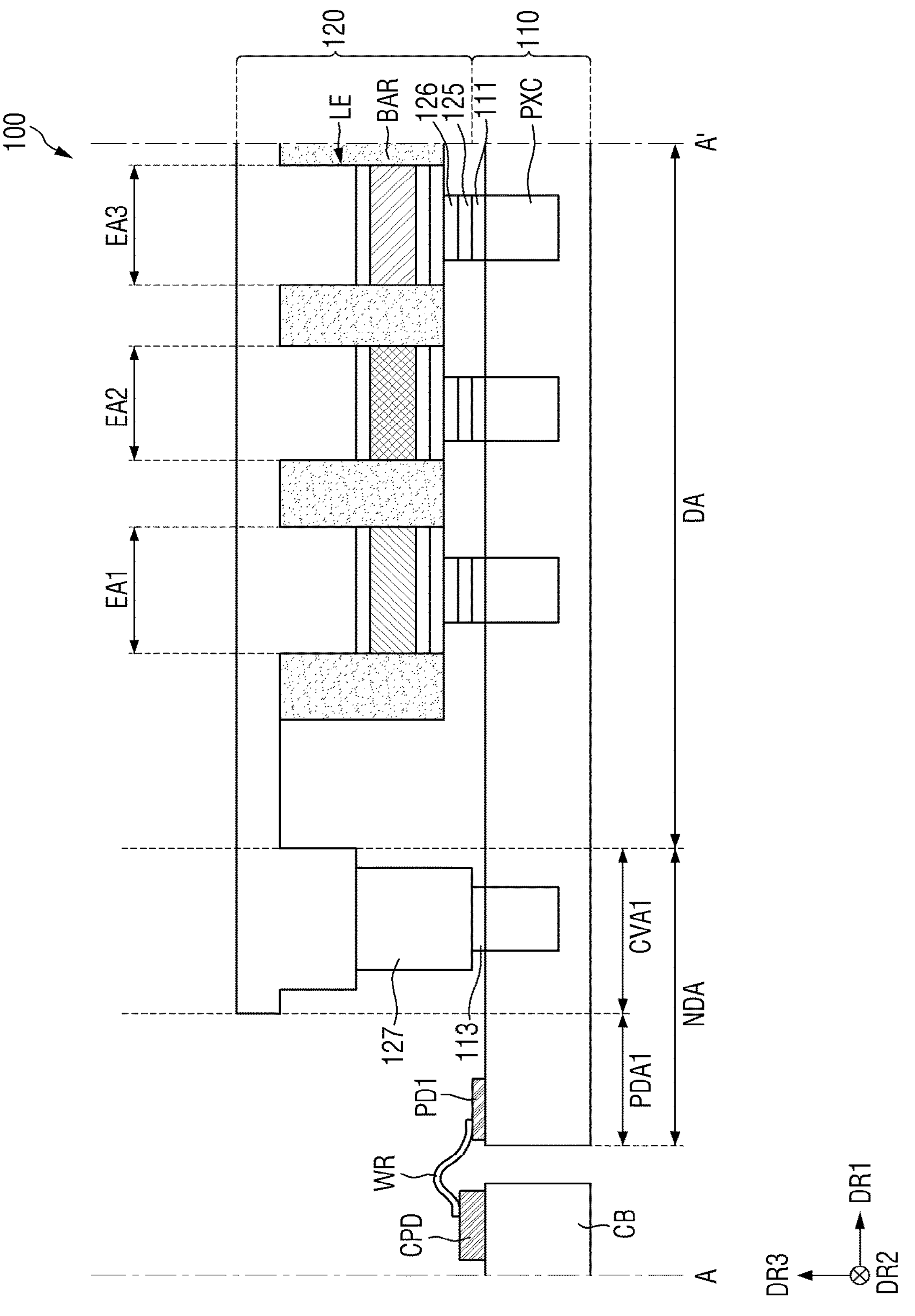
FIG. 4 is a cross-sectional view illustrating an example of a display panel taken along the line A-A' of FIG. 2.
Figure 5:
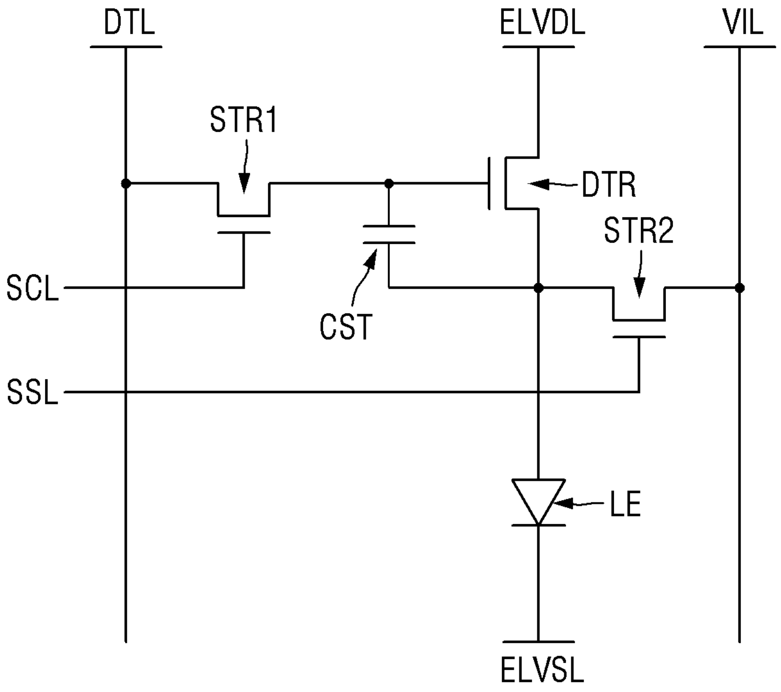
FIG. 5 is an equivalent circuit diagram of one pixel of the display device according to one or more embodiments.
Figure 6:
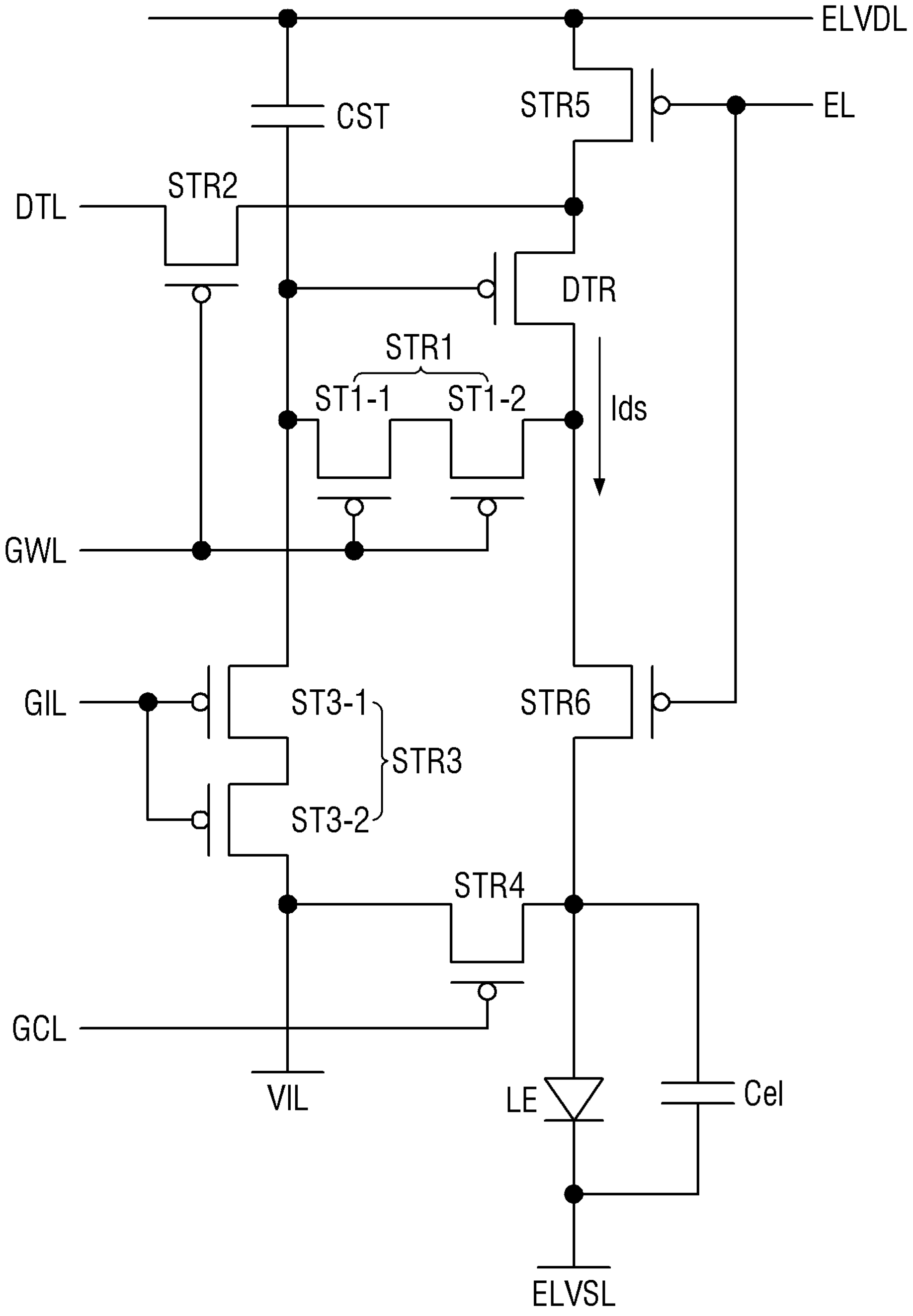
FIG. 6 is an equivalent circuit diagram of one pixel of the display device according to one or more embodiments.
Figure 7:
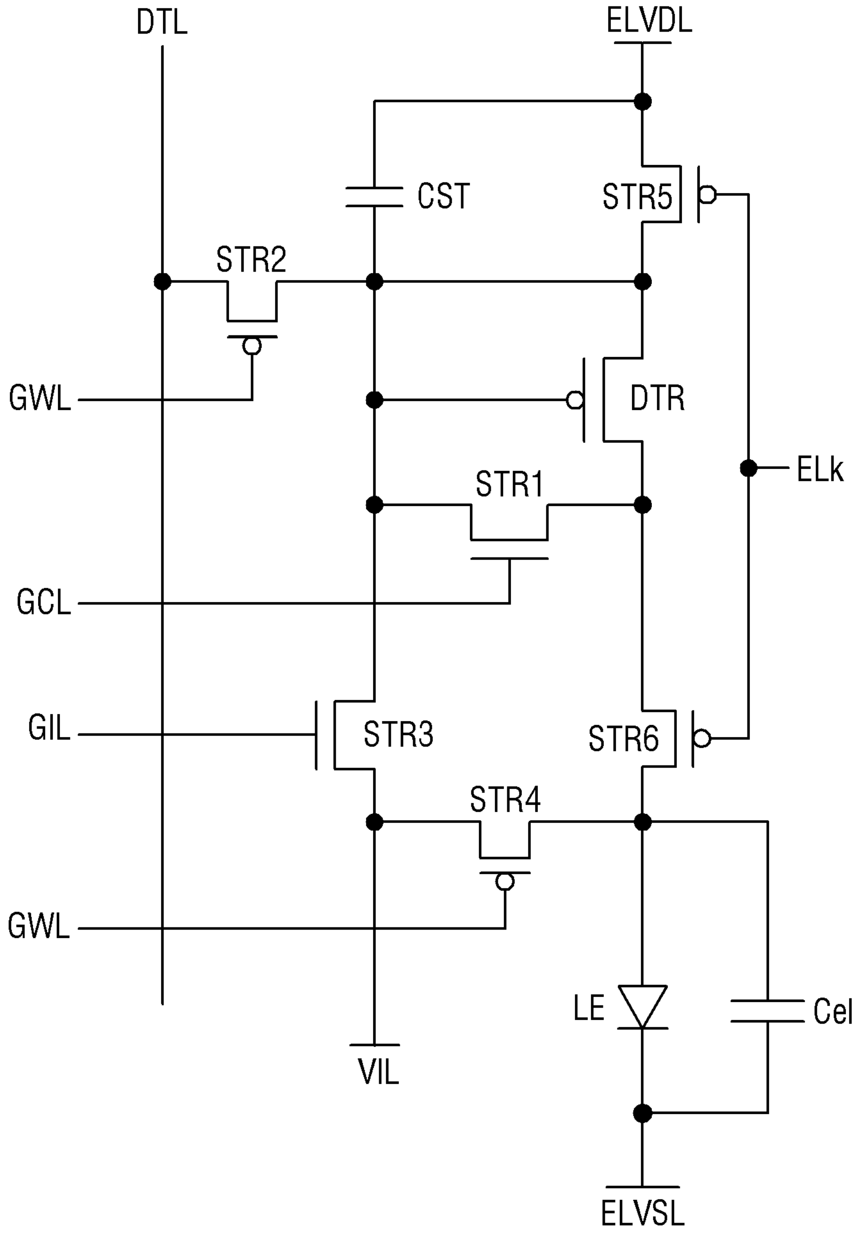
FIG. 7 is an equivalent circuit diagram of one pixel of the display device according to one or more embodiments.
Figure 8:
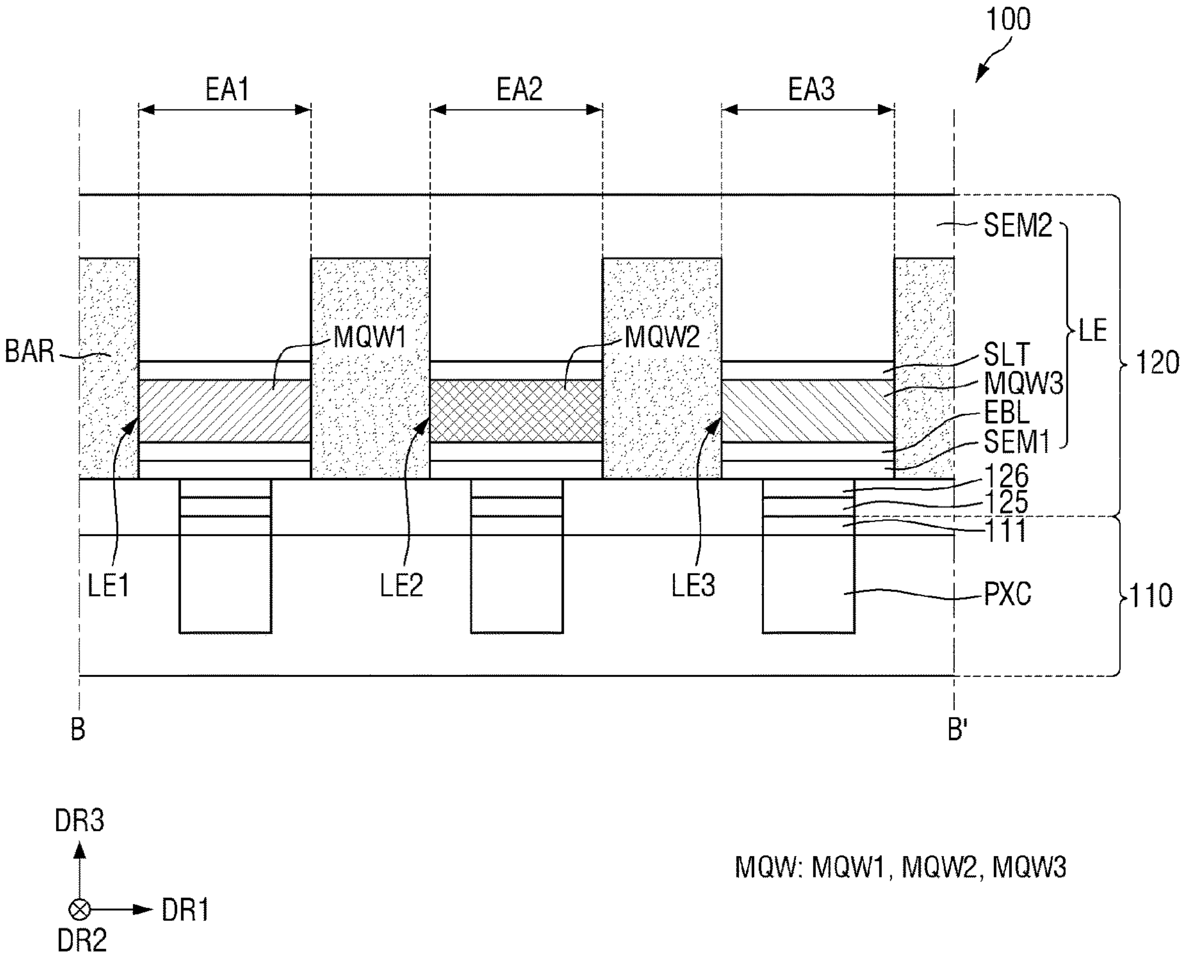
FIG. 8 is a cross-sectional view illustrating an example of a display panel taken along the line B-B' of FIG. 2.
Figure 9:
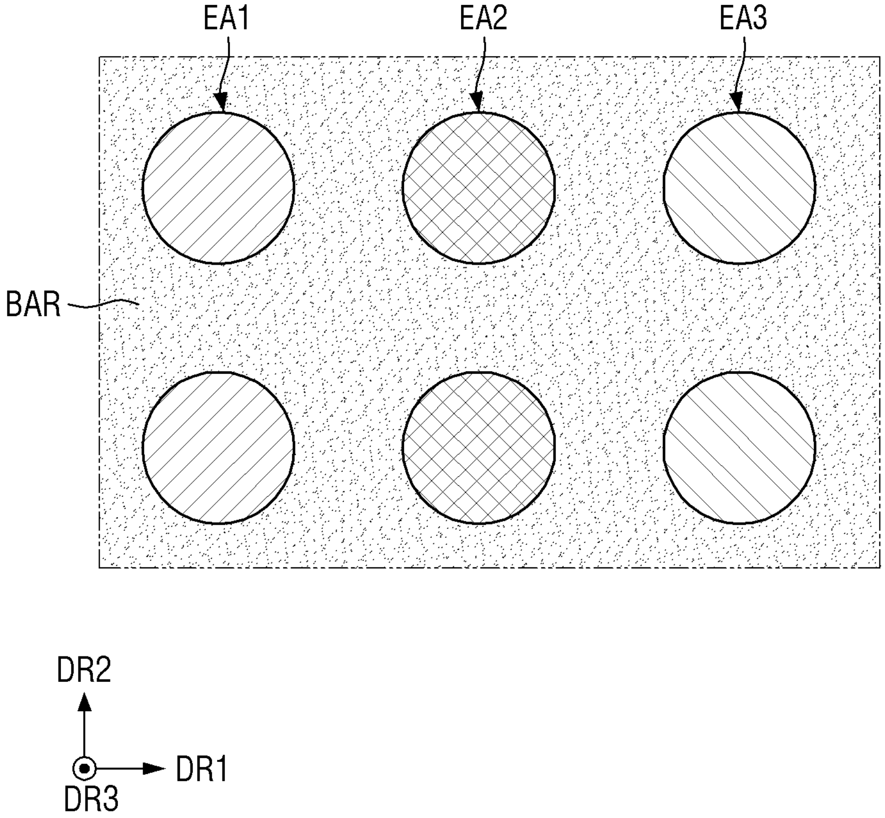
FIG. 9 is a plan view illustrating a layout of light emitting elements and a barrier layer.

FIG. 4 is a cross-sectional view illustrating an example of a display panel taken along the line A-A' of FIG. 2. FIG. 5 is an equivalent circuit diagram of one pixel of the display device according to one or more embodiments. FIG. 6 is an equivalent circuit diagram of one pixel of the display device according to one or more embodiments. FIG. 7 is an equivalent circuit diagram of one pixel of the display device according to one or more embodiments. FIG. 8 is a cross-sectional view illustrating an example of a display panel taken along the line B-B' of FIG. 2. FIG. 9 is a plan view illustrating a layout of light emitting elements and a barrier layer.

Referring to FIGS. 4 to 9, the display panel 100 may include the semiconductor circuit substrate 110 and a light emitting element layer 120.

The semiconductor circuit substrate 110 may include a plurality of pixel circuit units PXC, pixel electrodes 111, the first pads PD1, and a common contact electrode 113.

The semiconductor circuit substrate 110 that is a silicon wafer substrate formed by a semiconductor process may be a first substrate. The plurality of pixel circuit units PXC of the semiconductor circuit substrate 110 may be formed using a semiconductor process.

The plurality of pixel circuit units PXC may be disposed in the display area DA and the non-display area NDA. Each of the plurality of pixel circuit units PXC may be connected to a corresponding pixel electrode 111. That is, the plurality of pixel circuit units PXC may be connected to correspond to a plurality of pixel electrodes 111, respectively. Each of the plurality of pixel circuit units PXC may overlap a light emitting element LE in the third direction DR3.

Each of the plurality of pixel circuit units PXC may include at least one transistor formed by a semiconductor process. In addition, each of the plurality of pixel circuit units PXC may further include at least one capacitor formed by a semiconductor process. The plurality of pixel circuit units PXC may include, for example, a CMOS circuit. Each of the plurality of pixel circuit units PXC may apply a pixel voltage or an anode voltage to the pixel electrode 111.

Referring to FIG. 5, the plurality of pixel circuit units PXC according to one or more embodiments may include three transistors DTR, STR1, and STR2 and one storage capacitor CST.

The light emitting element LE emits light according to a current supplied through a driving transistor DTR. The light emitting element LE may be implemented as an inorganic light emitting diode, an organic light emitting diode, a micro light emitting diode, a nano light emitting diode or the like.

A first electrode (i.e., anode electrode) of the light emitting element LE is connected to a source electrode of the driving transistor DTR, and a second electrode (i.e., cathode electrode) of the light emitting element LE is connected to a second power line ELVSL to which a low potential voltage (e.g., a second source voltage) lower than a high potential voltage (e.g., a first source voltage) of a first power line ELVDL is supplied.

The driving transistor DTR adjusts a current flowing from the first power line ELVDL, to which the first source voltage is applied, to the light emitting element LE according to a voltage difference between a gate electrode and the source electrode. The gate electrode of the driving transistor DTR may be connected to a first electrode of a first transistor STR1, the source electrode of the driving transistor DTR may be connected to the first electrode of the light emitting element LE, and a drain electrode of the driving transistor DTR may be connected the first power line ELVDL to which the first source voltage is applied.

The first transistor STR1 is turned on by a scan signal applied from a scan line SCL to connect a data line DTL to the gate electrode of the driving transistor DTR. A gate electrode of the first transistor STR1 may be connected to the scan line SCL, the first electrode of the first transistor STR1 may be connected to the gate electrode of the driving transistor DTR, and a second electrode of the first transistor STR1 may be connected to the data line DTL.

A second transistor STR2 is turned on by a sensing signal applied from a sensing signal line SSL to connect an initialization voltage line VIL to the source electrode of the driving transistor DTR. A gate electrode of the second transistor STR2 may be connected to the sensing signal line SSL, the first electrode of the second transistor STR2 may be connected to the initialization voltage line VIL, and the second electrode of the second transistor STR2 may be connected to the source electrode of the driving transistor DTR.

In one or more embodiments, the first electrode of each of the first and second transistors STR1 and STR2 may be a source electrode, and the second electrode of each of the first and second transistors STR1 and STR2 may be a drain electrode. However, the present disclosure is not limited thereto, and the opposite case may be applied.

The storage capacitor CST is formed between the gate electrode and the source electrode of the driving transistor DTR. The storage capacitor CST stores a difference voltage between a gate voltage and a source voltage of the driving transistor DTR.

The driving transistor DTR, the first transistor STR1, and the second transistor STR2 may be formed as thin film transistors (TFTs). Further, in the description of FIG. 5, it is assumed that the driving transistor DTR, the first transistor STR1, and the second transistor STR2 are N-type metal oxide semiconductor field effect transistors (MOSFETs), but the present disclosure is not limited thereto. That is, the driving transistor DTR, the first transistor STR1, and the second transistor STR2 may be P-type MOSFETs, or some of the driving transistor DTR, the first transistor STR1, and the second transistor STR2 may be N-type MOSFETs, while others may be P-type MOSFETs.

Referring to FIG. 6, the first electrode of the light emitting element LE of the pixel circuit unit PXC according to one or more embodiments may be connected to a first electrode of a fourth transistor STR4 and a second electrode of a sixth transistor STR6, and the second electrode of the light emitting element LE of the pixel circuit unit PXC according to one or more embodiments may be connected to the second power line ELVSL. A parasitic capacitance Cel may be formed between the first electrode and the second electrode of the light emitting element LE.

Each pixel PX includes a driving transistor DTR, switch elements, and a capacitor CST. The switch elements include first through sixth transistors STR1 through STR6.

The driving transistor DTR includes a gate electrode, a first electrode, and a second electrode. The driving transistor DTR controls a drain-source current Ids (hereinafter, referred to as a "driving current") flowing between the first electrode and the second electrode according to a data voltage applied to the gate electrode of the driving transistor DTR. The first electrode of the driving transistor DTR may be connected to a fifth transistor STR5 and a second electrode of the driving transistor DTR is connected to the sixth transistor STR6.

The capacitor CST is formed between the gate electrode of the driving transistor DTR and the first power line ELVDL. One electrode of the capacitor CST may be connected to the gate electrode of the driving transistor DTR, and the other electrode may be connected to the first power line ELVDL.

When a first electrode of each of the first through sixth transistors STR1 through STR6 and the driving transistor DTR is a source electrode, a second electrode may be a drain electrode. Alternatively, when the first electrode of each of the first through sixth transistors STR1 through STR6 and the driving transistor DTR is a drain electrode, the second electrode may be a source electrode.

An active layer of each of the first through sixth transistors STR1 through STR6 and the driving transistor DTR may be made of any one of polysilicon, amorphous silicon, and an oxide semiconductor. When a semiconductor layer of each of the first through sixth transistors STR1 through STR6 and the driving transistor DTR is made of polysilicon, a process for forming the semiconductor layer may be a low-temperature polysilicon (LTPS) process.

In addition, although a case where the first through sixth transistors STR1 through STR6 and the driving transistor DTR are formed as P-type MOSFETs has been mainly described in FIG. 6, the present disclosure is not limited thereto, and the first through sixth transistors STR1 through STR6 and the driving transistor DTR may also be formed as N-type MOSFETs.

Furthermore, a first power supply voltage of a first power line ELVDL, a second power supply voltage of the second power line ELVSL, and a third power supply voltage of an initialization voltage line VIL may be set in consideration of characteristics of the driving transistor DTR, characteristics of the light emitting element LE, etc.

A first transistor STR1 (e.g., ST1-1, ST1-2) may be connected between the second electrode and the gate electrode of the driving transistor DTR. The gate electrodes of the first transistor (e.g., ST1-1, ST1-2) may be connected to a write scan wiring GWL.

A second transistor STR2 may be connected between the first electrode of the driving transistor DTR and a data line DTL. The gate electrode of the second transistor STR2 may be connected to the write scan wiring GWL.

A third transistor STR3 (e.g., ST3-1, ST3-2) may be connected between the gate electrode of the driving transistor DTR and the initialization voltage line VIL. The gate electrodes of the third transistor STR3 (e.g., ST3-1, ST3-2) may be connected to an initialization scan wiring GIL.

A fourth transistor STR4 may be connected between the light emitting element LE and the initialization voltage line VIL. The gate electrode of the fourth transistor STR4 may be connected to a control scan wiring GCL.

A fifth transistor STR5 may be connected between the first electrode of the driving transistor DTR and the first power line ELVDL and a sixth transistor STR6 may be connected between the second electrode of the driving transistor DTR and the light emitting element LE. The gate electrode of the fifth and sixth transistors STR5 and STR6 may be connected to an emission wiring EL.

Referring to FIG. 7, the pixel circuit unit PXC according to one or more embodiments is different from the embodiment of FIG. 6 in that a driving transistor DTR, a second transistor STR2, a fourth transistor STR4, a fifth transistor STR5, and a sixth transistor STR6 are formed as P-type MOSFETs, and a first transistor STR1 and a third transistor STR3 are formed as N-type MOSFETs.

An active layer of each of the driving transistor DTR, the second transistor STR2, the fourth transistor STR4, the fifth transistor STR5, and the sixth transistor STR6 formed as P-type MOSFETs may be made of polysilicon, and an active layer of each of the first transistor STR1 and the third transistor STR3 formed as N-type MOSFETs may be made of an oxide semiconductor.

The embodiment of FIG. 7 is different from the embodiment of FIG. 4 in that a gate electrode of the second transistor STR2 and a gate electrode of the fourth transistor STR4 are each connected to a write scan wiring GWL, and a gate electrode of the first transistor STR1 is connected to a control scan wiring GCL. In addition, because the first transistor STR1 and the third transistor STR3 are formed as N-type MOSFETs in FIG. 7, a scan signal of a gate high voltage may be transmitted to the control scan wiring GCL and an initialization scan wiring GIL. In contrast, because the second transistor STR2, the fourth transistor STR4, the fifth transistor STR5, and the sixth transistor STR6 are formed as P-type MOSFETs, a scan signal of a gate low voltage may be transmitted to the write scan wiring GWL and an emission wiring EL.

It should be noted that an equivalent circuit diagram of a pixel according to one or more embodiments of the present disclosure is not limited to those illustrated in FIGS. 5 through 7. The equivalent circuit diagram of the pixel according to embodiments of the present disclosure may also be formed in other known circuit structures that those skilled in the art can employ in addition to (or instead of) the embodiments illustrated in FIGS. 5 through 7.

In one or more embodiments, the plurality of pixel electrodes 111 may be disposed on the corresponding pixel circuit units PXC. Each of the pixel electrodes 111 may be an exposed electrode exposed from the pixel circuit unit PXC. Each of the pixel electrodes 111 may be formed integrally with the pixel circuit unit PXC. Each of the pixel electrodes 111 may receive the pixel voltage or the anode voltage supplied from the pixel circuit unit PXC. The pixel electrodes 111 may include at least one selected from among gold (Au), copper (Cu), tin (Sn), titanium (Ti), and silver (Ag). For example, the pixel electrode 111 may include a 9:1 alloy, an 8:2 alloy, or a 7:3 alloy of gold and tin or may include an alloy of copper, silver, and tin (SAC305).

The common contact electrode 113 may be disposed in the first common voltage supply area CVA1 of the non-display area NDA. The common contact electrode 113 may be disposed on both sides of the display area DA. The common contact electrode 113 may be connected to any one of the first pads PD1 of the first pad unit PDA1 through a circuit unit formed in the non-display area NDA to receive a common voltage. The common contact electrode 113 may include the same material as the pixel electrodes 111. That is, the common contact electrode 113 and the pixel electrodes 111 may be formed by the same process.

Each of the first pads PD1 may be connected to a pad electrode CPD of a circuit board CB through a conductive connection member such as a wire WR corresponding thereto. That is, the first pads PD1, the wires WR, and the pad electrodes CPD of the circuit board CB may be connected to each other in a one-to-one manner.

The circuit board CB may be a flexible film such as a flexible printed circuit board (FPCB), a printed circuit board (PCB), a flexible printed circuit (FPC), or a chip on film (COF).

In one or more embodiments, the second pads of the second pad portion PDA2 may be substantially the same as the above-described first pads PD1 and a description thereof will be omitted.

The light emitting element layer 120 may include light emitting elements LE, a connection electrode 125, an ohmic contact layer 126, and a common connection electrode 127.

The light emitting element layer 120 may include first light emission areas EA1, second light emission areas EA2, and third light emission areas EA3, which correspond to the respective light-emitting elements LE. The light emitting element LE may be disposed in each of the first light emission areas EA1, the second light emission areas EA2 and the third light emission areas EA3 in one-to-one correspondence.

The connection electrode 125 may be disposed on the pixel electrode 111. The connection electrode 125 may be bonded to the pixel electrode 111 to apply a light emitting signal to the light emitting element LE. The light emitting element LE may include at least one connection electrode 125. In the drawing, the light emitting element LE includes one connection electrode 125, but is not limited thereto. As the case may be, the light emitting element LE may include a larger number of connection electrodes 125, or may be omitted. The following description of the light emitting element LE may equally be applied to even the case that the number of connection electrodes 125 is varied or another structure is further included in the light emitting element LE.

The connection electrode 125 may reduce resistance between the light emitting element LE and an ohmic contact layer 126 when the light emitting element LE is electrically connected to the pixel electrode 111 in the display panel 100 according to one or more embodiments. The connection electrode 125 may include a conductive metal. For example, the connection electrode 125 may include at least one selected from among gold (Au), copper (Cu), tin (Sn), titanium (Ti), aluminum (Al), and silver (Ag). For example, the connection electrode 125 may include a 9:1 alloy, an 8:2 alloy or a 7:3 alloy of gold and tin, or may include an alloy (SAC305) of copper, silver and tin.

The ohmic contact layer 126 may be disposed on the connection electrode 125. The ohmic contact layer 126 may be disposed between the connection electrode 125 and a first semiconductor layer SEM1 of the light emitting element LE. The ohmic contact layer 126 may be an ohmic connection electrode, but is not limited thereto. The ohmic contact layer 126 may be a Schottky connection electrode. The ohmic contact layer 126 may include ITO, but is not limited thereto, and may include at least one selected from among gold (Au), copper (Cu), tin (Sn), titanium (Ti), aluminum (Al), and silver (Ag), or may be formed in their alloy or their multi-layered structure.

The light emitting element LE may be disposed on the pixel electrode 111 in each of the first light emission areas EA1, the second light emission areas EA2, and the third light emission areas EA3. The light emitting element LE may be a vertical light-emitting diode element longitudinally extended in the third direction DR3. That is, a length of the light emitting element LE in the third direction DR3 may be longer than that in a horizontal direction. The length of the light emitting element LE in the horizontal direction indicates a length in the first direction DR1 or a length in the second direction DR2. For example, the length of the light emitting element LE in the third direction DR3 may be 1 μm to 5 μm, approximately.

The light emitting element LE may be a micro light-emitting diode element. The light emitting element LE may include a first semiconductor layer SEM1, an electron blocking layer EBL, an active layer MQW (e.g., MQW1, MQW2, MQW3), a superlattice layer SLT, and a second semiconductor layer SEM2, in the third direction DR3. The first semiconductor layer SEM1, the electron blocking layer EBL, the active layer MQW, the superlattice layer SLT, and the second semiconductor layer SEM2 may sequentially be deposited in the third direction DR3.

The light emitting element LE may have a cylindrical shape, a disk shape or a rod shape, which has a width greater than a height, but is not limited thereto. The light emitting element LE may have a shape, such as a rod, a wire, and a tube, and a polygonal pillar shape such as a cube, a rectangular parallelepiped, and a hexagonal pillar, or may have various shapes such as an outer surface shape partially inclined and extended in one direction.

The first semiconductor layer SEM1 may be disposed on the ohmic contact layer 126. The first semiconductor layer SEM1 may be a p-type semiconductor, and may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer SEM1 may be any one or more selected from among AlGaInN, GaN, AlGaN, InGaN, AlN, and InN, which are doped with a p-type dopant. The first semiconductor layer SEM1 may be doped with a p-type dopant, and the p-type dopant may be Mg, Zn, Ca, Se, Ba, or the like. For example, the first semiconductor layer SEM1 may be a p-GaN doped with p-type Mg. A thickness of the first semiconductor layer SEM1 may range from 30 nm to 200 nm, but is not limited thereto.

The electron blocking layer EBL may be disposed on the first semiconductor layer SEM1. The electron blocking layer EBL may be a layer for suppressing or preventing too many electrons from flowing to the active layer MQW. For example, the electron blocking layer EBL may be p-AlGaN doped with p-type Mg. A thickness of the electron blocking layer EBL may range from 10 nm to 50 nm, approximately, but is not limited thereto. The electron blocking layer EBL may be omitted.

The active layer MQW may be disposed on the electron blocking layer EBL. The active layer MQW may emit light by combination of electron-hole pairs in accordance with an electrical signal applied through the first semiconductor layer SEM1 and the second semiconductor layer SEM2.

The active layer MQW may include a single or multiple quantum well structure material. When the active layer MQW includes a multiple quantum well structure material, a plurality of well layers and a plurality of barrier layers may alternately be deposited. In this case, the well layer may be formed of, but not limited to, InGaN, and the barrier layer may be formed of, but not limited to, GaN or AlGaN. A thickness of the well layer may be 1 nm to 4 nm, approximately, and a thickness of the barrier layer may be 3 nm to 10 nm, approximately.

The active layer MQW may have a structure in which semiconductor materials having a high band gap energy and semiconductor materials having a low band gap energy are alternately deposited, and may include different Group III to Group V semiconductor materials depending on a wavelength range of light that is emitted. The light emitted from the active layer MQW is not limited to the first light (e.g., light of a blue wavelength band), and the active layer MQW may emit second light (e.g., light of a green wavelength band) or third light (e.g., light of a red wavelength band) as the case may be.

In one or more embodiments, when the semiconductor material included in the active layer MQW is indium, a color of light that is emitted may be varied depending on a content of indium. In one or more embodiments, a first active layer MQW1 included in a first light emitting element LE1 may include about 10% to 15% indium and may emit light in a blue wavelength band. A second active layer MQW2 included in a second light emitting element LE2 may include about 20% to 25% indium and may emit light in a green wavelength band. A third active layer MQW3 included in a third light emitting element LE3 may include about 30% to 45% indium and may emit light in a red wavelength band.

The superlattice layer SLT may be disposed on the active layer MQW. The superlattice layer SLT may be a layer for mitigating stress between the second semiconductor layer SEM2 and the active layer MQW. For example, the superlattice layer SLT may be formed of InGaN or GaN. A thickness of the superlattice layer SLT may be 50 nm to 200 nm, approximately. The superlattice layer SLT may be omitted.

The second semiconductor layer SEM2 may be disposed on the superlattice layer SLT. The second semiconductor layer SEM2 may be an n-type semiconductor. The second semiconductor layer SEM2 may include a semiconductor material having a chemical formula of AlxGayIn1-x-yN ($0 \le x \le 1$, $0 \le y \le 1$, $0 \le x+y \le 1$). For example, the second semiconductor layer SEM2 may be any one or more of AlGaInN, GaN, AlGaN, InGaN, AlN and InN, which are doped with an n-type dopant. The second semiconductor layer SEM2 may be doped with an n-type dopant, and the n-type dopant may be Si, Ge, Sn, or the like. For example, the second semiconductor layer SEM2 may be an n-GaN doped with n-type Si. A thickness of the second semiconductor layer SEM2 may range from 2 μm to 4 μm, but is not limited thereto.

As shown in FIGS. 4 to 8, the second semiconductor layer SEM2 may be a common layer that is commonly connected to the plurality of light emitting elements LE. At least a portion of the second semiconductor layer SEM2 may be disposed in each of the light emitting elements LE in the third direction DR3 to form a patterned shape, and the other portion of the second semiconductor layer SEM2 may continuously be extended in the first direction DR1 and commonly disposed in the plurality of light emitting elements LE. The second semiconductor layer SEM2 allows the common voltage applied through the common contact electrode 113 to be commonly applied to the plurality of light emitting elements LE. A thickness of an area of the second semiconductor layer SEM2, which is overlapped with the first semiconductor layer SEM1 of the light emitting element LE, may be greater than a thickness of an area of the second semiconductor layer SEM2, which is not overlapped with the first semiconductor layer SEM1.

The common connection electrode 127 may be disposed in the first common voltage supply area CVA1 of the non-display area NDA. The common connection electrode 127 may be disposed on one surface of the second semiconductor layer SEM2. The common connection electrode 127 may serve to transfer a common voltage signal of the light emitting elements LE from the common contact electrode 113. The common connection electrode 127 may be made of the same material as that of the connection electrodes 125. For connection with the common contact electrode 113, the common connection electrode 127 may be formed to be thick in the third direction DR3.

The light emitting elements LE may receive a pixel voltage or an anode voltage of the pixel electrode 111 through the connection electrode 125 and may receive a common voltage through the second semiconductor layer SEM2. The light emitting element LE may emit light with a desired luminance (e.g., a predetermined luminance) in accordance with a voltage difference between the pixel voltage and the common voltage.

A barrier layer BAR may partition each light emitting element and partition each emission areas EA1, EA2, and EA3. The barrier layer BAR may be disposed to be around (e.g., to surround) the light emitting elements LE and may be in direct contact with side surfaces (e.g., peripheral or circumferential surfaces) of the light emitting elements LE. Accordingly, the light emitting elements LE may not be exposed to external foreign materials such as dust or air in processes for fabrication of the display device.

The barrier layer BAR may include the same material as the second semiconductor layer SEM2, the superlattice layer SLT, the active layer MQW, the electron blocking layer EBL, and the first semiconductor layer SEM1 of the light emitting elements LE. In one or more embodiments, the barrier layer BAR may include a semiconductor material having a chemical formula of AlxGayIn1-x-yN ($0 \le x \le 1$, $0 \le y \le 1$, $0 \le x+y \le 1$). For example, the barrier layer BAR may be one or more selected from among AlGaInN, GaN, AlGaN, InGaN, AlN, and InN. In one or more embodiments, the barrier layer BAR may include gallium nitride (GaN).

In addition, the barrier layer BAR may be doped with a suitable dopant (e.g., a predetermined dopant), and the dopant may be different from the dopant of the second semiconductor layer SEM2 and the dopant of the first semiconductor layer SEM1 described above. The dopant may be, for example, iron (Fe) or carbon (C). In one or more embodiments, the barrier layer BAR may be gallium nitride (GaN) doped with iron or carbon. The dopant traps electrons to prevent electrons from flowing in the barrier layer BAR, so that the barrier layer BAR acts as a high-resistance insulating layer. Accordingly, the barrier layer BAR may be around (e.g., may surround) each light emitting element LE to partition each of the emission areas EA1, EA2, and EA3.

The dopant to be doped into the barrier layer BAR may be included in a suitable amount (e.g., a predetermined amount). For example, as a dopant included in the barrier layer BAR, a doping concentration of iron or carbon may be in the range of $1\times10^{17}$ to $1\times10^{20}/cm^3$. The dopant doped in the above-described range may trap electrons to prevent electrons from flowing in the barrier layer BAR, thereby allowing the barrier layer BAR to act as an insulating layer.

In one or more embodiments, in the case that the barrier layer BAR includes aluminum nitride (AlN), the energy bandgap of the barrier layer BAR may be greater than the energy bandgap of the first semiconductor layer SEM1 of the light emitting element LE. Some of the carriers (e.g., holes and electrons) injected into the light emitting elements LE may move inside the light emitting elements LE, and some others may move along the surface of the light emitting elements LE. If the energy bandgap of the barrier layer BAR is greater than the energy bandgap of the first semiconductor layer SEM1 of the light emitting elements LE, carriers may not be unable to move along the side surface of the first semiconductor layer SEM1 in contact with the barrier layer BAR and may be induced to move inside the first semiconductor layer SEM1. Accordingly, the efficiency of the element may be improved by increasing carriers recombining in the active layer MQW of the light emitting element LE.

The barrier layer BAR may be formed by growing a second semiconductor layer SEM2 like the manufacturing method to be described later. For example, when the second semiconductor layer SEM2 includes gallium nitride, the barrier layer BAR may be formed by growing gallium nitride. That is, the layers of each of the light emitting elements LE and the barrier layer BAR may be formed of the same material. When the light emitting elements LE and the barrier layer BAR are made of different materials, a lattice constant difference occurs between the light emitting elements LE and the barrier layer BAR, so that the light emitting elements LE and the barrier layer BAR may cause defects at the interface. Here, the defect may be a dangling bond in which the surface of the light emitting element LE is exposed and Ga or N atoms are exposed. The dangling bond traps electrons or holes moving to the active layer MQW, thereby reducing the efficiency of the light emitting element LE. In the present embodiment, by forming the barrier layer BAR including the same material as the light emitting devices LE, it is possible to prevent a difference in lattice constant between the light emitting elements LE and the barrier layer BAR, thereby preventing a decrease in the efficiency of the light emitting element LE.

In addition, the barrier layer BAR may be first formed before the light emitting elements LE are formed, and the light emitting devices LE may be formed, like the manufacturing method to be described later. Here, when the barrier layer BAR is formed after the light emitting elements LE are formed, dopants may be diffused into the first semiconductor layer SEM1 of the light emitting elements LE during dopant doping process of the barrier layer BAR. Accordingly, the crystal quality of the first semiconductor layer SEM1 may be deteriorated, and the emission area of the light emitting element LE may be damaged and element efficiency may be reduced. In one or more embodiments, it is possible to prevent device efficiency from being reduced by forming the barrier layer BAR before forming the light emitting element LE.

According to one or more embodiments, the barrier layer BAR may be disposed to not overlap with the first semiconductor layer SEM1, the active layer MQW, the electron blocking layer EBL, and the superlattice layer SLT of each of the light emitting elements LE. The barrier layer BAR may be disposed on the second semiconductor layer SEM2 of each of the light emitting elements LE. The region of the second semiconductor layer SEM2 in which the barrier layer BAR is disposed may be a region that does not overlap with the first semiconductor layer SEM1, the active layer MQW, the electron blocking layer EBL, and the superlattice layer SLT from among the second semiconductor layers SEM2. For example, as shown in FIG. 4, the thickness of the second semiconductor layer SEM2 overlapping the barrier layer BAR may be smaller than the thickness of the second semiconductor layer SEM2 overlapping the active layer MQW of each light emitting element LE.

One surface of the barrier layer BAR may be aligned with one surface of the first semiconductor layer SEM1 to coincide with each other. For example, as shown in FIG. 8, the lower surface of the barrier layer BAR and the lower surface of the first semiconductor layer SEM1 may be aligned with each other (e.g., may be in the same plane). The distance (e.g., height) between the lower surface of the barrier layer BAR and the upper surface of the second semiconductor layer SEM2 may be the same as the distance (e.g., height) between the lower surface of the light emitting element LE and the upper surface of the second semiconductor layer SEM2. However, the present disclosure is not limited thereto, and the distance (e.g., height) between the lower surface of the barrier layer BAR and the upper surface of the second semiconductor layer SEM2 may be smaller than the distance (e.g., height) between the lower surface of the light emitting element LE and the upper surface of the second semiconductor layer SEM2. The length (e.g., height) of the barrier layer BAR may be about 0.1 μm to 10 μm, but is not limited thereto.

In the above-described embodiment, the first active layer MQW1 of the first light emitting element LE1, the second active layer MQW2 of the second light emitting element LE2, and the third active layer MQW3 of the third light emitting element LE3 are exemplified to emit the first light of blue color, the second light of green color, and the third light of red color, respectively. However, the present disclosure is not limited thereto, and the first active layer MQW1 of the first light emitting element LE1, the second active layer MQW2 of the second light emitting element LE2, and the third active layer MQW3 of the third light emitting element LE3 may all emit first light of blue color, second light of green color, third light of red color, or emit light in an ultraviolet wavelength band.

Hereinafter, a manufacturing process of the display device 10 according to one or more embodiments of the present disclosure will be described with reference to other drawings.

Figure 10:
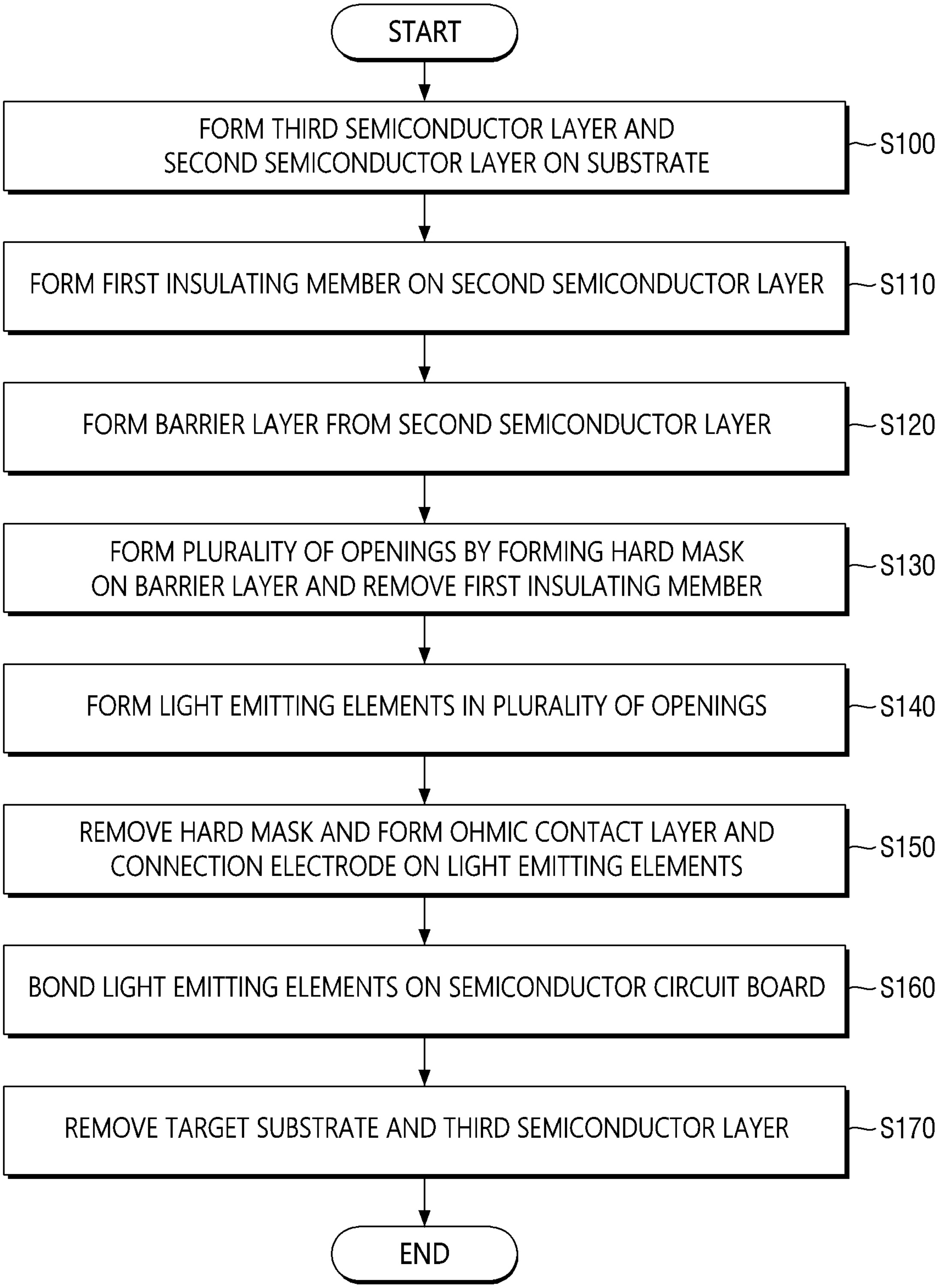
FIG. 10 is a flowchart illustrating a method of manufacturing a display device according to one or more embodiments.

FIG. 10 is a flow chart illustrating a method for manufacturing a display device according to one or more embodiments of the present disclosure. FIGS. 11 to 21 are cross-sectional views illustrating a method for manufacturing a display device according to one or more embodiments of the present disclosure.

In FIGS. 11 to 21, a structure based on the order of forming the respective layers of the display panel 100 of the display device 10 is shown as a cross-section. In FIGS. 11 to 21, the manufacturing process of the light emitting element layer 120 is mainly shown, which may correspond to the cross-sectional view of FIG. 8. Hereinafter, a method for manufacturing the display panel shown in FIGS. 11 to 21 will be described in conjunction with FIG. 10.

Figure 11:
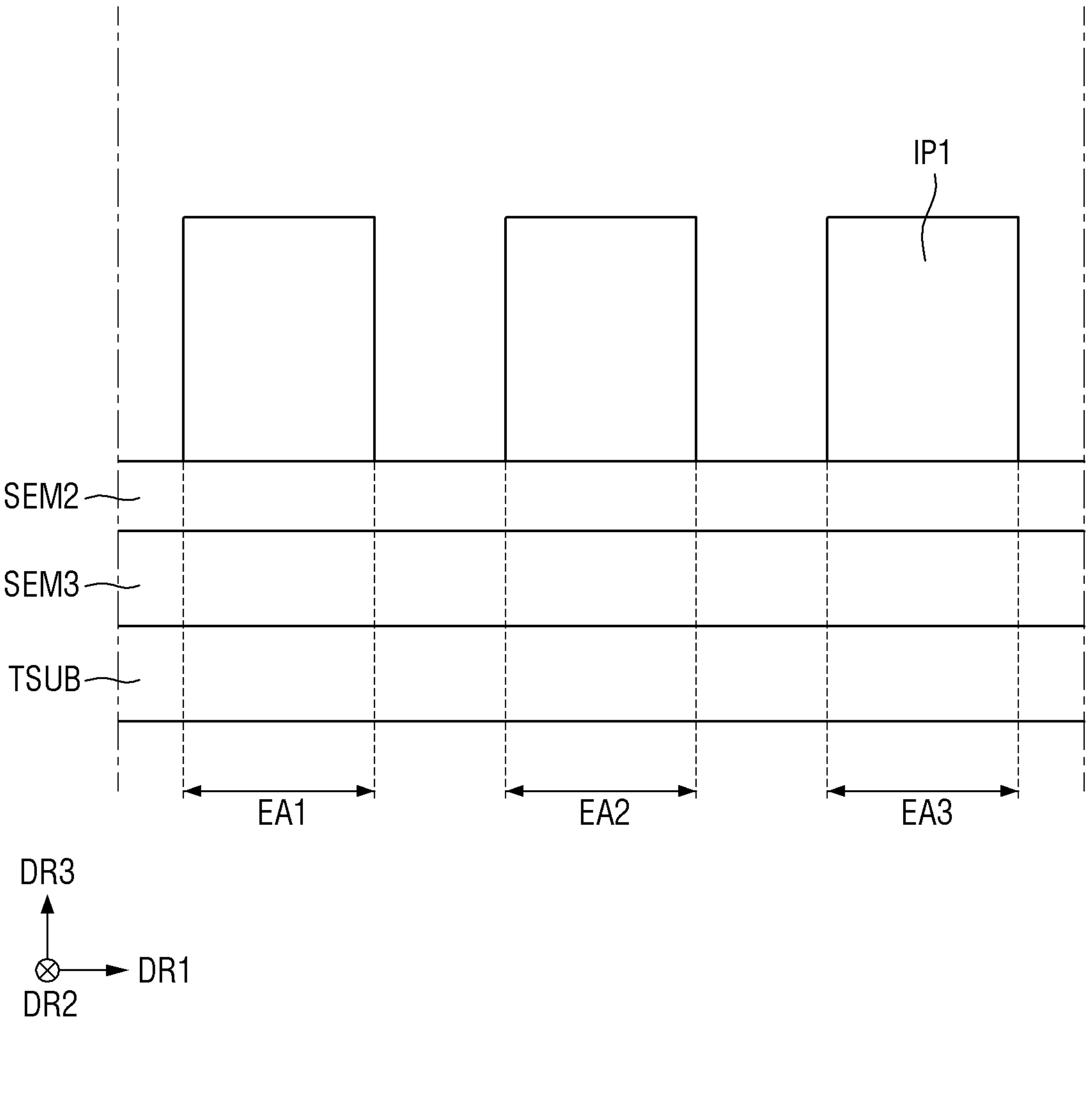
FIGS. 11 to 21 are cross-sectional views for describing a method of manufacturing a display device according to one or more embodiments.

Referring to FIG. 11, a third semiconductor layer SEM3 and a second semiconductor layer SEM2 are formed on a target substrate TSUB (S100 of FIG. 10).

First of all, the target substrate TSUB is prepared. The target substrate TSUB may be a sapphire substrate ($Al_2O_3$), but is not limited thereto. In one or more embodiments, a case that the target substrate TSUB is a sapphire substrate will be described by way of example.

The third semiconductor layer SEM3 and the second semiconductor layer SEM2 are formed on the target substrate TSUB. The third semiconductor layer SEM3 and the second semiconductor layer SEM2, which are grown by an epitaxial method, may be formed by growing a seed crystal. In this case, the third semiconductor layer SEM3 and the second semiconductor layer SEM2 may be formed by an electron beam deposition method, a physical vapor deposition (PVD) method, a chemical vapor deposition (CVD) method, a plasma laser deposition (PLD) method, a dual-type thermal evaporation method, sputtering, a metal organic chemical vapor deposition (MOCVD) method, etc. Preferably, the third semiconductor layer SEM3 and the second semiconductor layer SEM2 may be formed by the MOCVD method, but is not limited thereto.

There is no special limitation in a precursor material for forming the third semiconductor layer SEM3 and the second semiconductor layer SEM2 within the range that may typically be selected to form a target material. For example, the precursor material may be a metal precursor that includes an alkyl group such as a methyl group or an ethyl group. For example, the precursor material may be a compound such as trimethyl gallium ($Ga(CH_3)_3$), trimethyl aluminum ($Al(CH_3)_3$), and triethyl phosphate ($(C_2H_5)_3PO_4$), but is not limited thereto.

In detail, the third semiconductor layer SEM3 is formed on the target substrate TSUB. The third semiconductor layer SEM3 is deposited as a single layer as shown, but is not limited thereto. The third semiconductor layer SEM3 may be deposited as a plurality of layers. The third semiconductor layer SEM3 may be disposed to reduce a lattice constant difference between the second semiconductor layer SEM2 and the target substrate TSUB. For example, the third semiconductor layer SEM3 may include an undoped semiconductor, and may be a material that is not doped with an n-type or p-type dopant. In one or more embodiments, the third semiconductor layer SEM3 may be at least one selected from among InAlGaN, GaN, AlGaN, InGaN, AlN, and InN, which is undoped, but is not limited thereto.

The second semiconductor layer SEM2 is formed on the third semiconductor layer SEM3 by the above-described method.

Subsequently, a plurality of first insulating members IP1 are formed on the second semiconductor layer SEM2. (S110 of FIG. 10)

In detail, an insulating material layer is formed on the second semiconductor layer SEM2 and then patterned by a photolithography method to form the plurality of first insulating members IP1. The insulating material layer may be made of an inorganic insulating material such as silicon oxide, silicon nitride, and silicon oxynitride.

Figure 12:
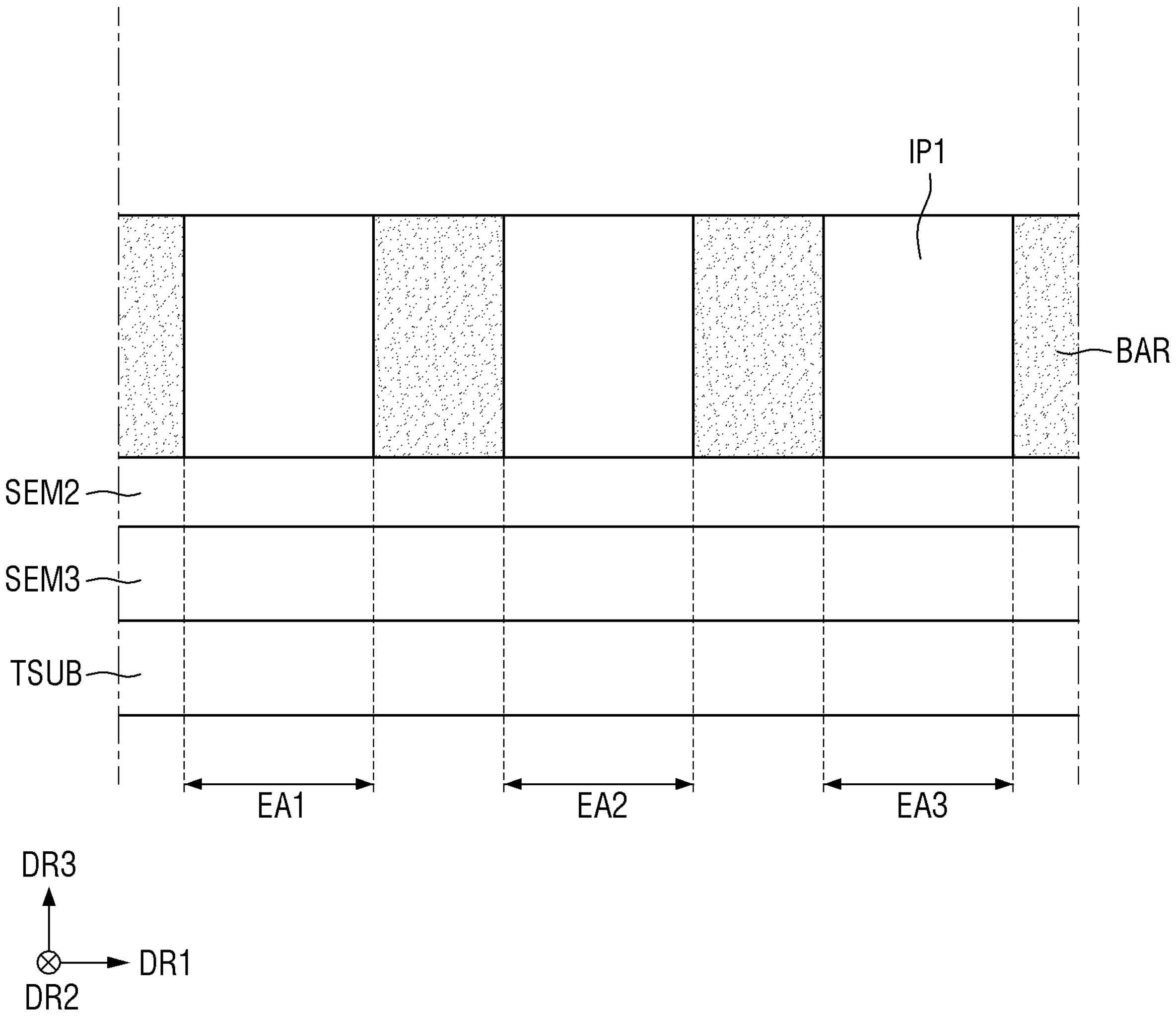

Then, referring to FIG. 12, the barrier layer BAR is formed on the second semiconductor layer SEM2. (S120 of FIG. 10)

The barrier layer BAR is formed on the target substrate TSUB from the second semiconductor layer SEM2 by the above-described epitaxial method. The second semiconductor layer SEM2 acts as a seed on the second semiconductor layer SEM2 exposed by the first insulating members IP1, whereby the barrier layer BAR is grown between the first insulating members IP1. In this case, the dopant may be included in the barrier layer BAR by flowing a reactive gas as a dopant while growing the barrier layer BAR by the epitaxial method. The dopant may be iron or carbon described above. Accordingly, the barrier layer BAR may be formed of a semiconductor material including the dopant. The barrier layer BAR may be formed to the same height as the insulating member IP1.

Figure 13:
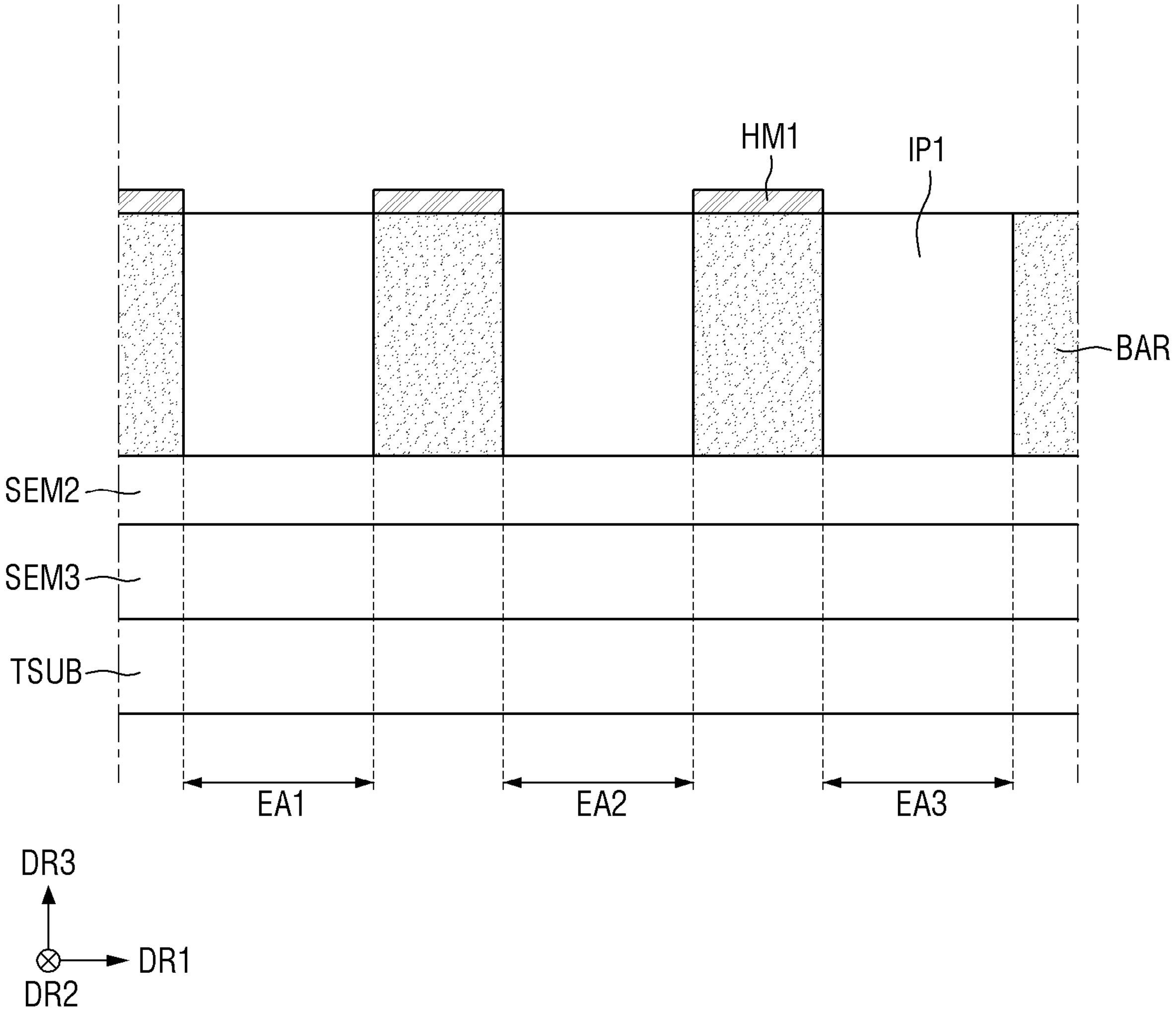
Figure 14:
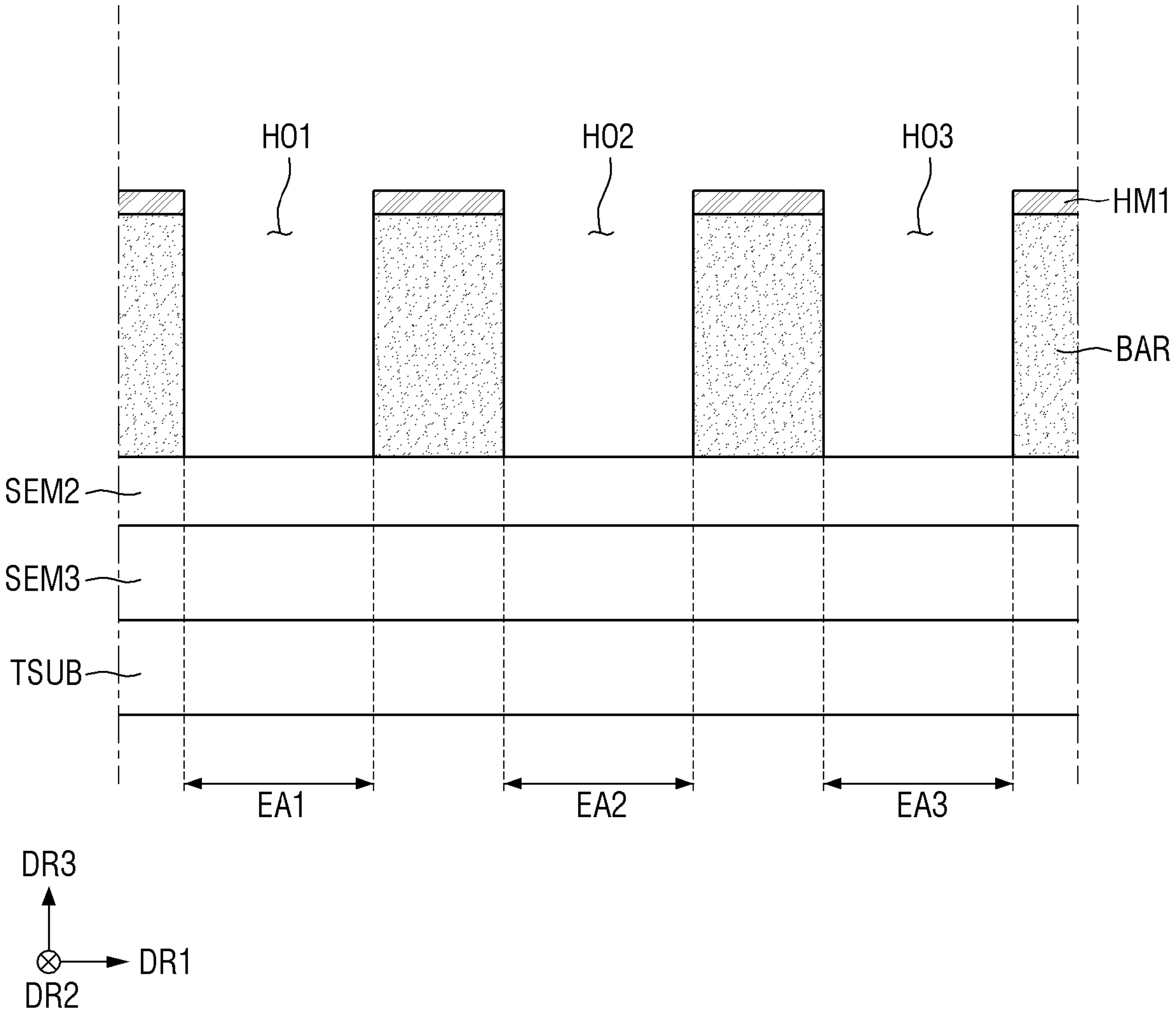

Next, referring to FIGS. 13 and 14, a plurality of openings HO1, HO2, and HO3 are formed by forming a hard mask HM1 on the barrier layer BAR and removing the first insulating member IP1. (S130 in FIG. 10)

Specifically, the hard mask HM1 is formed by stacking an insulating material layer on the target substrate TSUB on which the barrier layer BAR and the first insulating member IP1 are formed and patterning the material layer using a photolithography method. The hard mask HM1 is formed to overlap the barrier layer BAR and not to overlap the first insulating member IP1. In addition, the hard mask HM1 is formed of a material different from that of the first insulating member IP1.

Subsequently, the first insulating member IP1 exposed by the hard mask HM1 is etched to form a plurality of openings HO1, HO2, and HO3. Because the hard mask HM1 and the first insulating member IP1 are made of different materials, the first insulating member IP1 may be selectively removed. A plurality of openings HO1, HO2, and HO3 exposing a top surface of the second semiconductor layer SEM2 may be formed by removing the first insulating member IP1. The plurality of openings HO1, HO2, and HO3 may include the first opening HO1, the second opening HO2, and the third opening HO3 that are spaced from each other.

Figure 15:
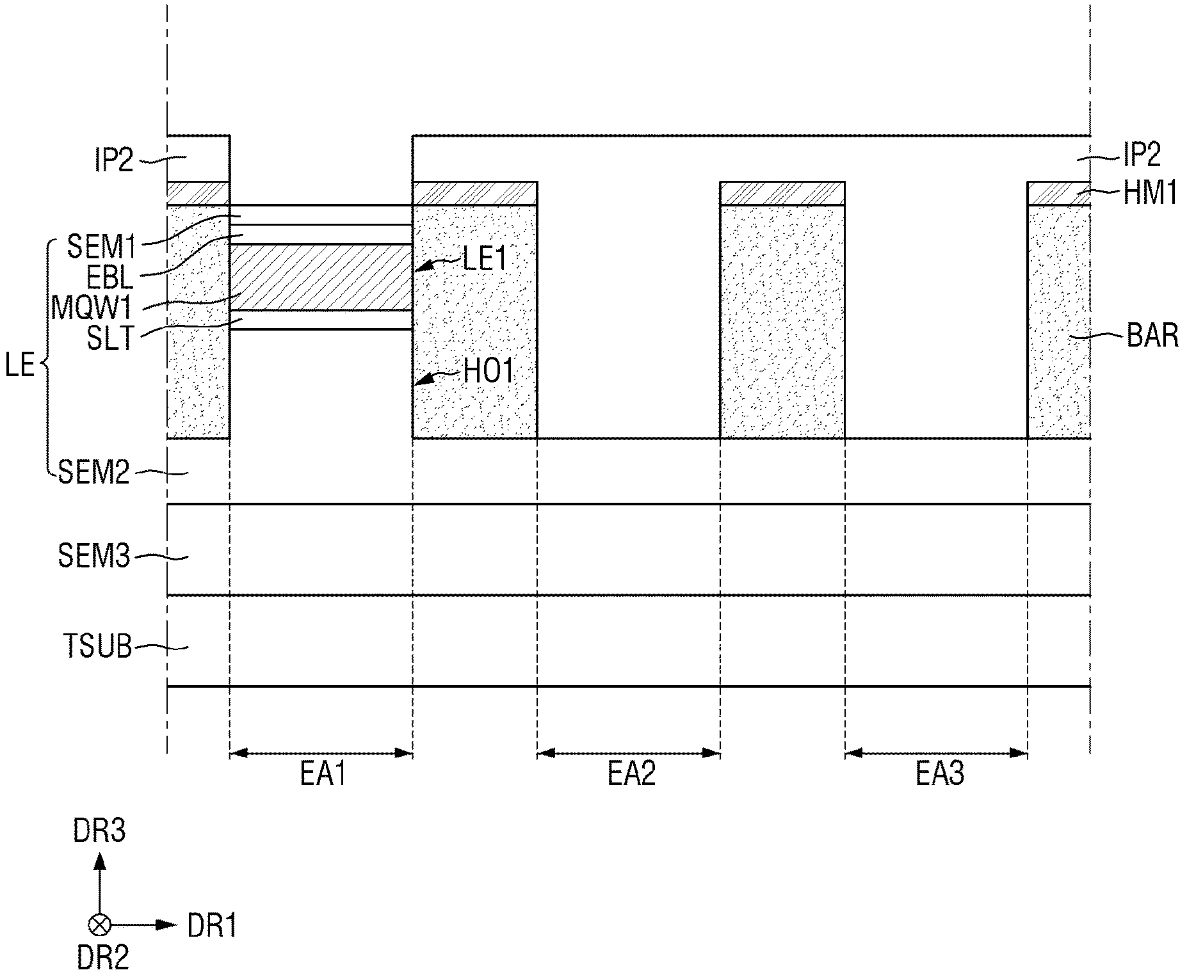
Figure 16:
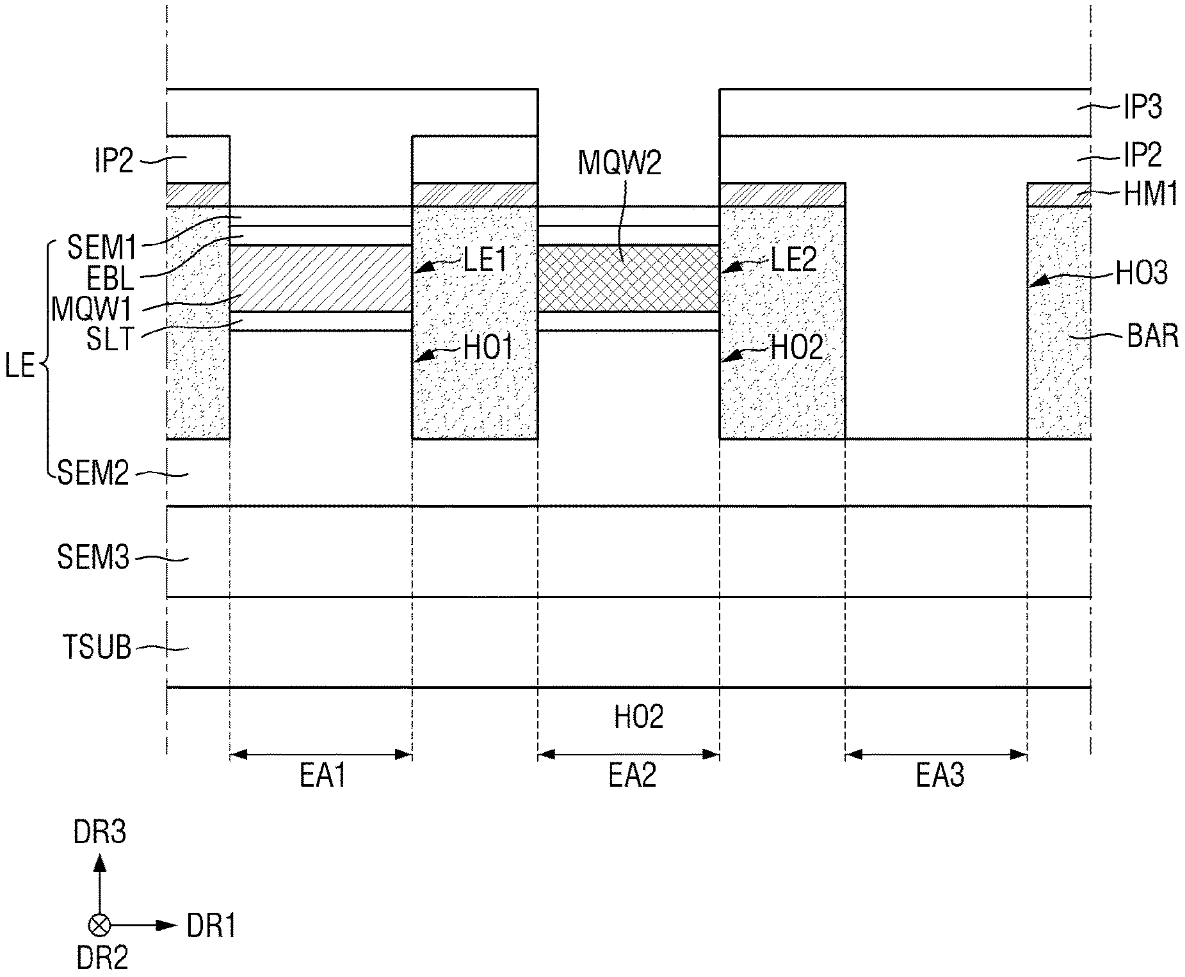
Figure 17:
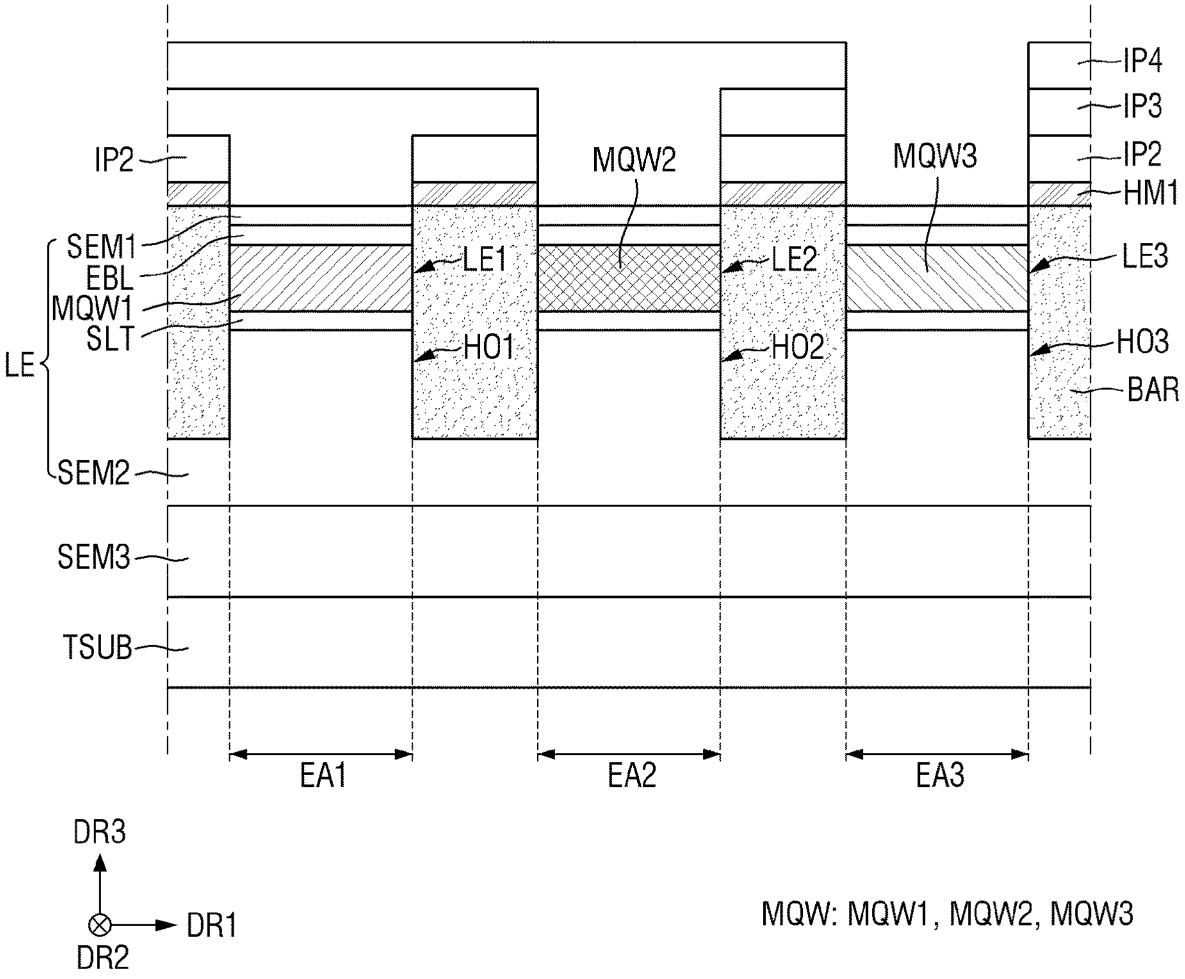

Next, referring to FIGS. 15 to 17, the plurality of light emitting elements LE1, LE2, and LE3 are formed in the plurality of openings HO1, HO2, and HO3. (S140 of FIG. 10)

First, an insulating material layer is stacked on the target substrate TSUB on which the plurality of openings HO1, HO2, and HO3 and the hard mask HM1 are formed and patterned by a photolithography method to form a second insulating member IP2. The insulating material layer may use an inorganic insulating material such as silicon oxide, silicon nitride, or silicon oxynitride. The second insulating member IP2 may be formed to expose the first opening HO1.

Subsequently, the second semiconductor layer SEM2 is further formed on the target substrate TSUB by the above-described epitaxial method. The second semiconductor layer SEM2 acts as a seed on the second semiconductor layer SEM2 exposed by the first opening HO1 to further grow the second semiconductor layer SEM2 in the first opening HO1. Next, the superlattice layer SLT, the first active layer MQW1, the electron blocking layer EBL, and the first semiconductor layer SEM1 are sequentially formed on the second semiconductor layer SEM2 by using the above-described epitaxial method. In one or more embodiments, the top surface of the first semiconductor layer SEM1 may be formed to be aligned with and coincide with the top surface of the barrier layer BAR. However, the present disclosure is not limited thereto. Accordingly, the first light emitting element LE1 may be formed in the plurality of first openings HO1. The first active layer MQW1 of the first light emitting element LE1 may include approximately 10% to 15% of indium to emit first light of blue color.

Next, as shown in FIG. 16, a third insulating member IP3 covering the second insulating member IP2 and the first light emitting element LE1 is formed. Specifically, an insulating material layer is stacked on the target substrate TSUB on which the first insulating member IP1 and the first light emitting element LE1 are formed and patterned by a photolithography method to form the third insulating member IP3. The insulating material layer may use an inorganic insulating material such as silicon oxide, silicon nitride, or silicon oxynitride. The third insulating member IP3 may be formed to expose the second opening HO2.

Subsequently, the second semiconductor layer SEM2 is further formed on the target substrate TSUB by the above-described epitaxial method. The second semiconductor layer SEM2 acts as a seed on the second semiconductor layer SEM2 exposed by the second opening HO2, whereby the second semiconductor layer SEM2 is further grown in the second opening HO2. Subsequently, the superlattice layer SLT, the second active layer MQW2, an electron blocking layer EBL, and the first semiconductor layer SEM1 are sequentially formed on the second semiconductor layer SEM2 by using the above-described epitaxial method. As a result, the second light emitting element LE2 may be formed in the plurality of second openings HO2. The second active layer MQW2 of the second light emitting element LE2 may include about 20% to 25% indium to emit second light of green color.

Next, as shown in FIG. 17, a fourth insulating member IP4 covering the third insulating member IP3 and the second light emitting element LE2 is formed. Specifically, an insulating material layer is stacked on the target substrate TSUB on which the third insulating member IP3 and the second light emitting element LE2 are formed and patterned by a photolithography method to form the fourth insulating member IP4. The insulating material layer may use an inorganic insulating material such as silicon oxide, silicon nitride, or silicon oxynitride. The fourth insulating member IP4 may be formed to expose the third opening HO3.

Subsequently, the second semiconductor layer SEM2 is further formed on the target substrate TSUB by the above-described epitaxial method. The second semiconductor layer SEM2 acts as a seed on the second semiconductor layer SEM2 exposed by the third opening HO3, whereby the second semiconductor layer SEM2 is further grown in the third opening HO3. Subsequently, the superlattice layer SLT, the third active layer MQW3, the electron blocking layer EBL, and the first semiconductor layer SEM1 are sequentially formed on the second semiconductor layer SEM2 by using the above-described epitaxial method. As a result, the third light emitting element LE3 may be formed in the plurality of third openings HO3. The third active layer MQW3 of the third light emitting element LE3 may include about 30% to 45% indium to emit second light of red color.

Figure 18:
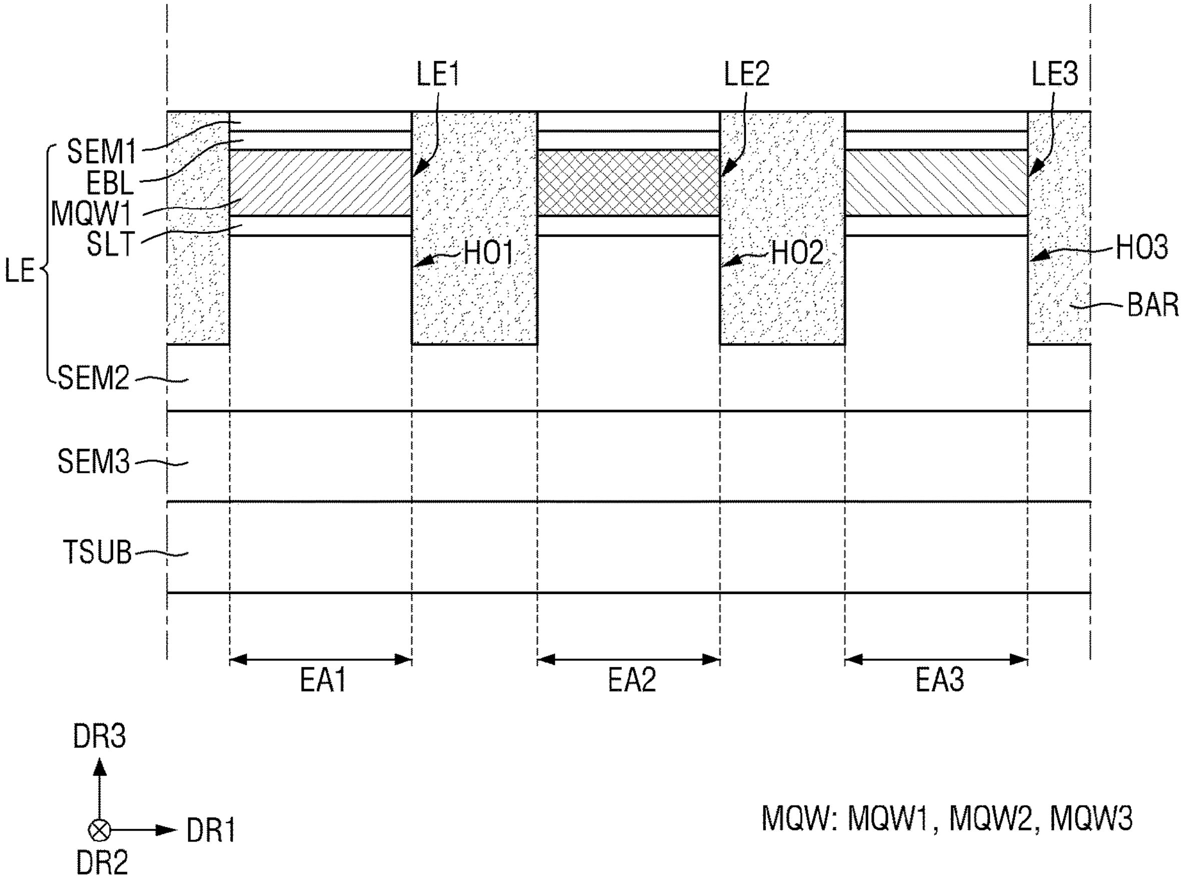
Figure 19:
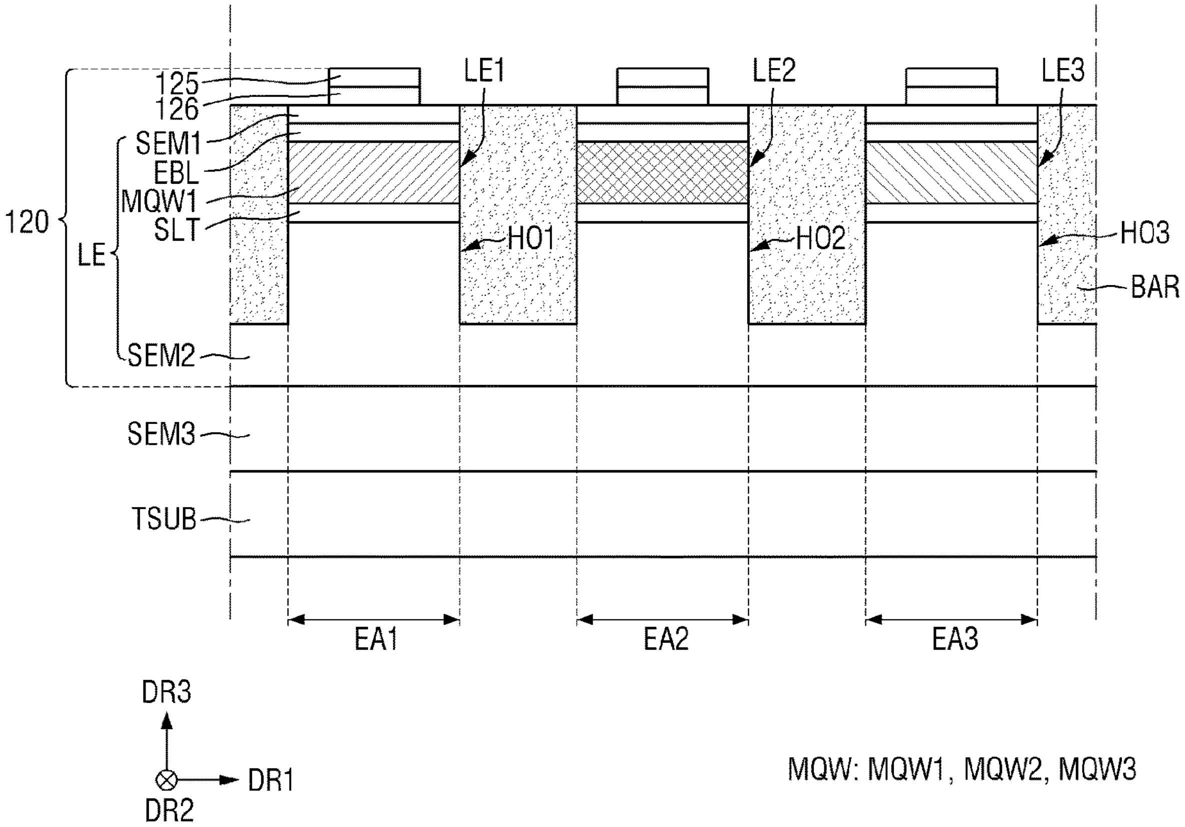

Next, as shown in FIGS. 18 and 19, the hard mask HM1 is removed, and the ohmic contact layer 126 and the connection electrode 125 are formed on the light emitting elements LE. (S150 of FIG. 10)

The hard mask HM1, the second insulating member IP2, the third insulating member IP3, and the fourth insulating member IP4 formed on the target substrate TSUB are removed by etching. The etching process may be dry etching, wet etching, reactive ion etching (RIE), deep reactive ion etching (DRIE), inductively coupled plasma reactive ion etching (ICP-RIE), or the like. Accordingly, the first light emitting element LE1, the second light emitting element LE2, and the third light emitting element LE3 are formed on the target substrate TSUB.

Subsequently, as shown in FIG. 19, the ohmic contact layers 126 and the connection electrodes 125 are formed on the plurality of light emitting elements LE.

Specifically, by sequentially stacking electrode material layers on the target substrate TSUB and etching the same, ohmic contact layers 126 and connection electrodes 125 are formed on the plurality of light emitting elements LE1, LE2, and LE3. The ohmic contact layers 126 may be directly formed on the top surface of the first semiconductor layer SEM1 of each of the light emitting elements LE1, LE2, and LE3. The connection electrodes 125 may be formed on top of each of the light emitting elements LE1, LE2, and LE3.

Figure 20:
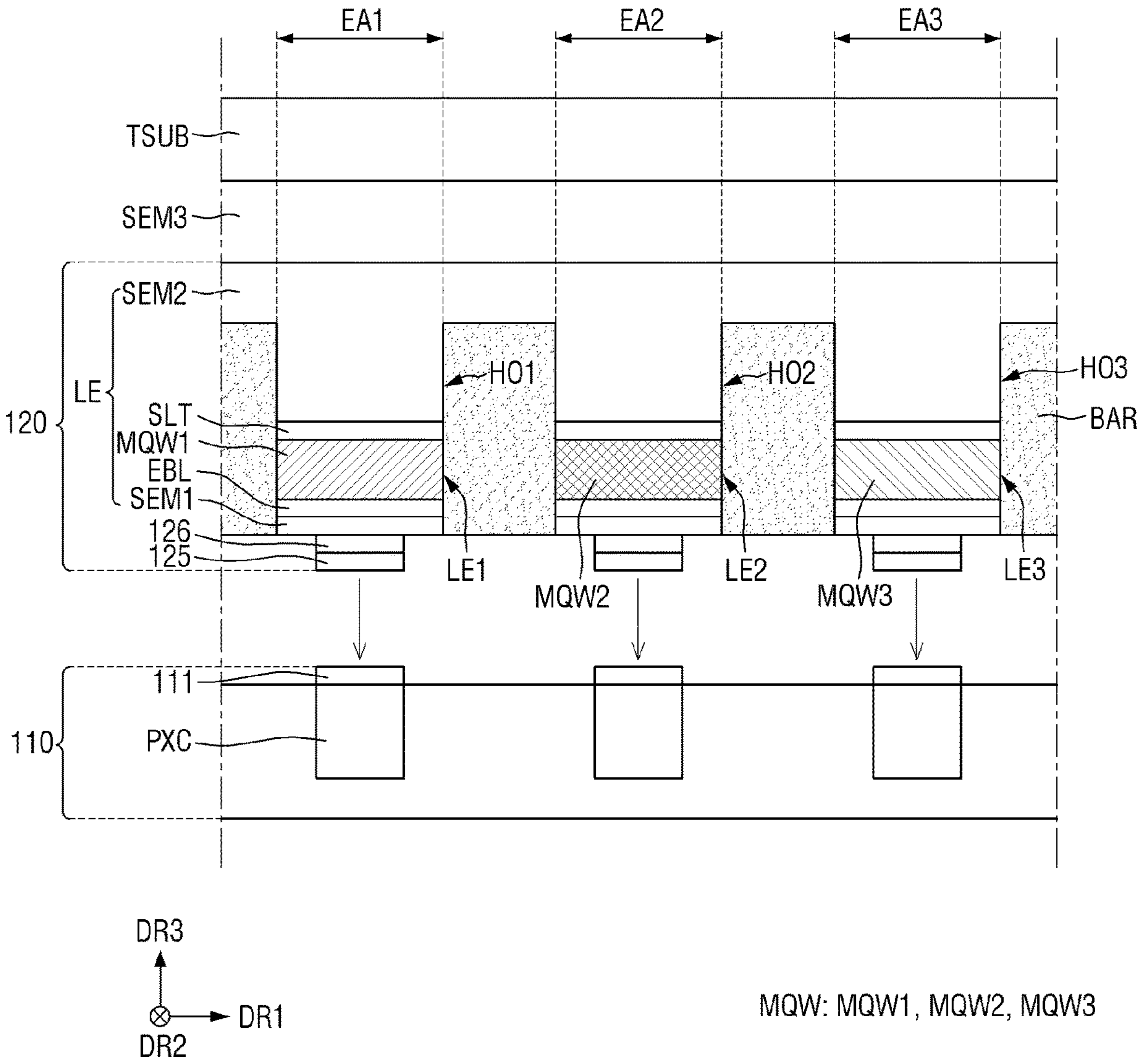

Next, referring to FIG. 20, the first to third light emitting elements LE1, LE2, and LE3 are bonded to the semiconductor circuit board 110. (S160 in FIG. 10)

First, the semiconductor circuit board 110 is prepared. The semiconductor circuit board 110 may include the plurality of pixel circuit units PXC and the pixel electrode 111.

Specifically, the pixel electrode 111 is formed on the semiconductor circuit substrate 110 on which the plurality of pixel circuit units PXC are formed. Next, the target substrate TSUB is aligned on the semiconductor circuit substrate 110. Alignment keys may be respectively disposed on the semiconductor circuit substrate 110 and the target substrate TSUB to align the semiconductor circuit substrate 110 and the target substrate TSUB. Next, the semiconductor circuit substrate 110 and the target substrate TSUB are bonded together.

Specifically, the pixel electrode 111 of the semiconductor circuit substrate 110 and the connection electrode 125 of each of the light emitting elements LE1, LE2, and LE3 are brought into contact with each other. Next, each light emitting element LE1, LE2, and LE3 is bonded to the semiconductor circuit substrate 110 by melt bonding the pixel electrodes 111 and the connection electrodes 125 at a suitable temperature (e.g., a predetermined temperature).

Figure 21:
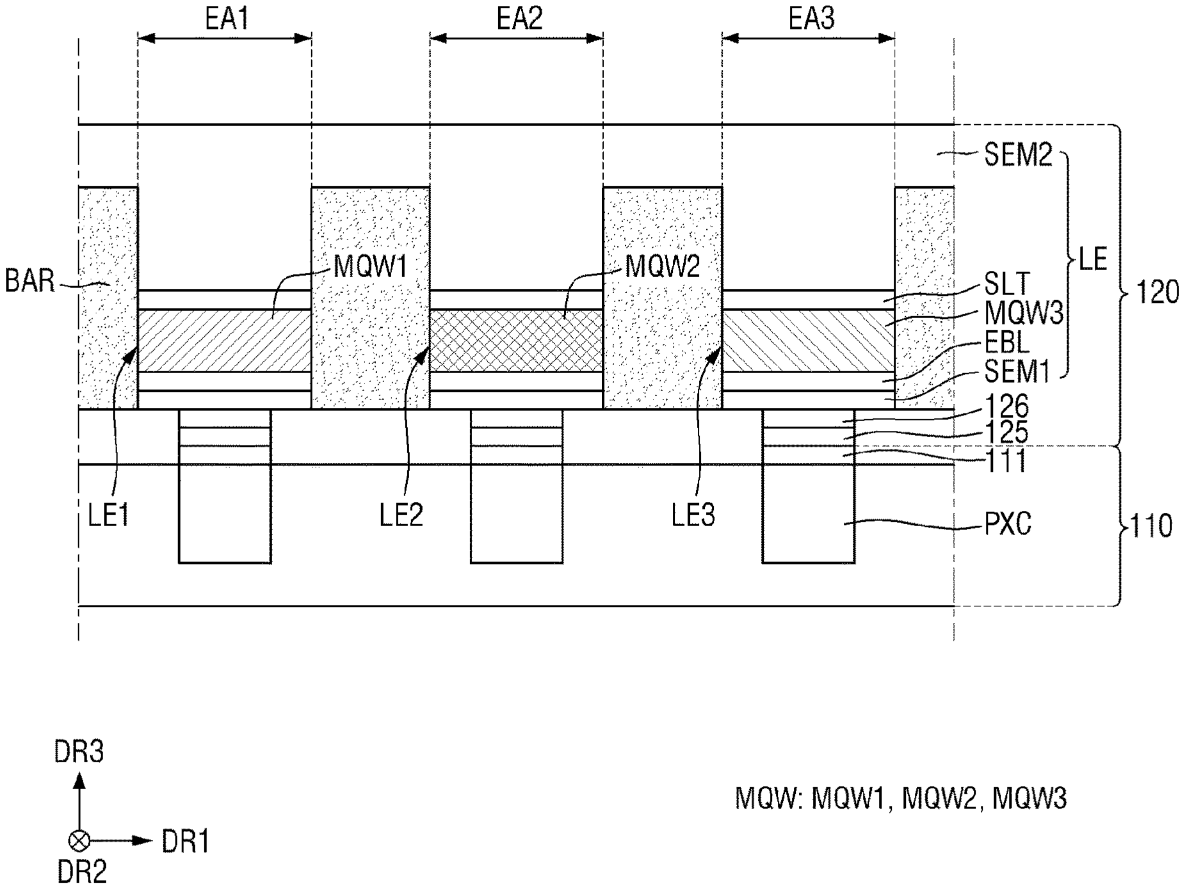

Next, referring to FIG. 21, a display panel is manufactured by removing the target substrate TSUB and the third semiconductor layer SEM3. (S170 in FIG. 10)

Specifically, the target substrate TSUB is separated from the third semiconductor layer SEM3. The process of separating the target substrate TSUB may be separated by a laser lift off (LLO) process. The laser lift-off process uses a laser, and a KrF excimer laser (e.g., 248 nm wavelength) may be used as a source. The energy density of the excimer laser is irradiated in the range of about 550 $mJ/cm^2$ to 950 $mJ/cm^2$, and the incident area may be in the range of 50×50 $\mu m^2$ to 1×1 $cm^2$ but the present disclosure is not limited thereto.

The third semiconductor layer SEM3 may be removed through a polishing process such as a chemical mechanical polishing (CMP) process and/or an etching process. In one or more embodiments, the third semiconductor layer SEM3 may be removed through a polishing process such as a chemical mechanical polishing (CMP) process or may be removed by wet etching or dry etching.

As described above, as the barrier layer BAR is formed to grow from the second semiconductor layer SEM2 to include the same material, a lattice constant difference between the light emitting elements LE and the barrier layer BAR may be prevented from occurring to prevent a decrease in the efficiency of the light emitting element LE. In addition, by forming the barrier layer BAR before the formation of the light emitting element LE, it is possible to prevent a decrease in device efficiency of the light emitting element LE due to the dopant of the barrier layer BAR.

Figure 22:
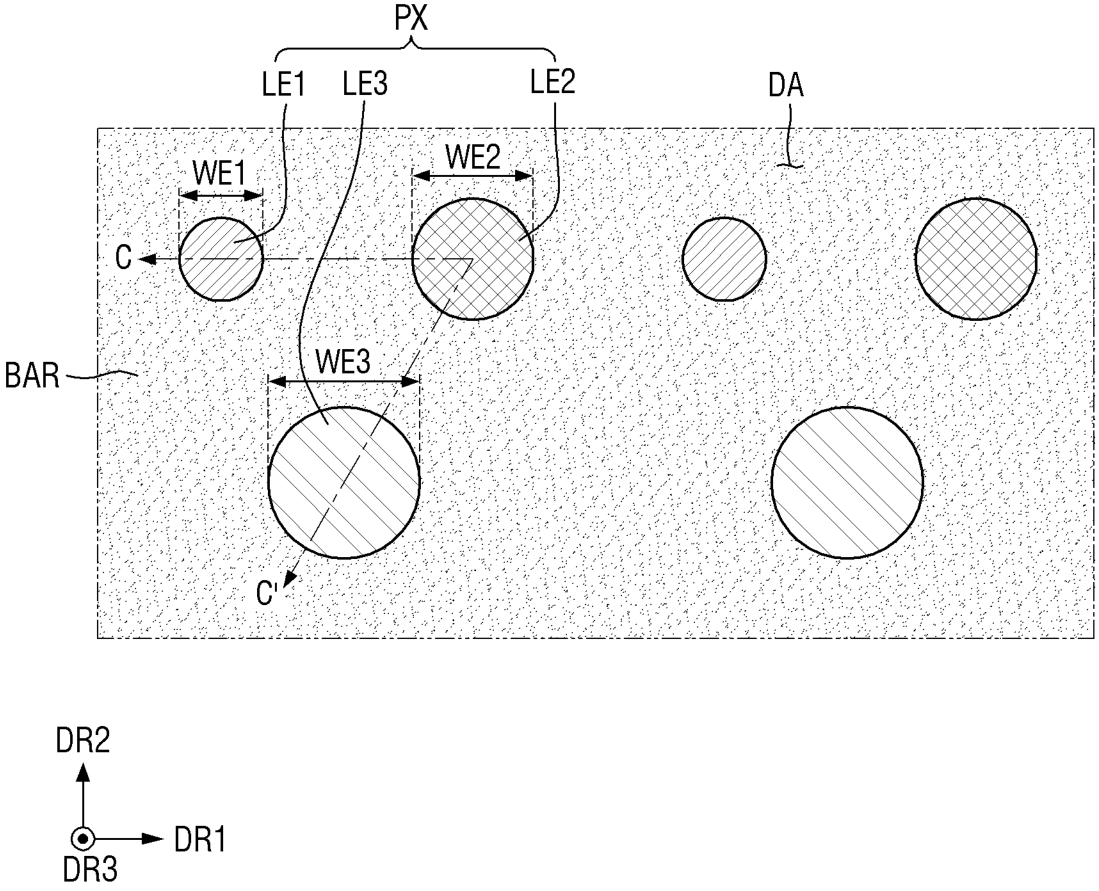
FIG. 22 is a plan view illustrating a partial area of a display panel of a display device according to one or more embodiments.
Figure 23:
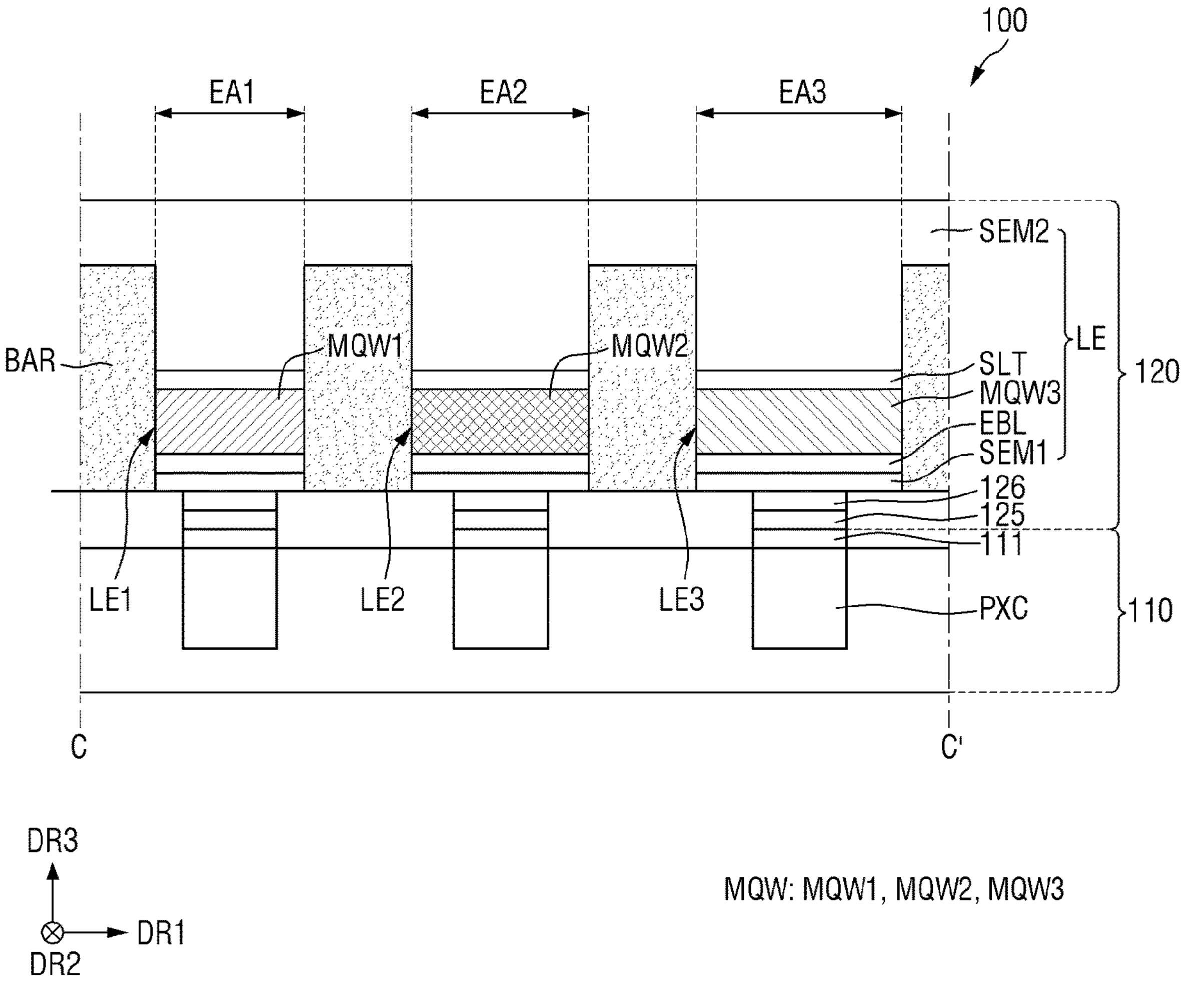
FIG. 23 is a cross-sectional view taken along the line C-C' of FIG. 22.

FIG. 22 is a plan view illustrating a partial area of a display panel of a display device according to one or more embodiments. FIG. 23 is a cross-sectional view taken along the line C-C' of FIG. 22.

Referring to FIGS. 22 and 23, the present embodiment is different from the above-described embodiment in that the content of indium in the active layer MQW of each of the first light emitting element LE1, the second light emitting element LE2, and the third light emitting element LE3 is different and the diameters are different from each other. FIGS. 22 and 23 will be mainly described with respect to differences from the above-described embodiment.

Referring to FIGS. 22 and 23, the first light emitting element LE1 may include the first active layer MQW1, the second light emitting element LE2 may include the second active layer MQW2, and the third light emitting device LE3 may include the third active layer MQW3.

When each active layer MQW1, MQW2, and MQW3 is made of InGaN, the color of light emitted from each of the active layers MQW1, MQW2, and MQW3 may vary according to the content of indium (In). For example, as the content of indium (In) increases, the wavelength band of light emitted by the active layer moves to a red wavelength band, and as the content of indium (In) decreases, the wavelength band of light emitted by the active layer may shift to a blue wavelength band. The content of indium in the first active layer MQW1 of the first light emitting element LE1 may be less than the content of indium in the second active layer MQW2 of the second light emitting element LE2 or the third active layer MQW3 of the third light emitting element LE3. The content of indium in the second active layer MQW2 of the second light emitting element LE2 may be less than the content of indium in the third active layer MQW3 of the third light emitting element LE3.

Like in a manufacturing method to be described later, the first light emitting element LE1, the second light emitting element LE2, and the third light emitting element LE3 may be concurrently (e.g., simultaneously) formed. For example, the first active layer MQW1 of the first light emitting element LE1, the second active layer MQW2 of the second light emitting element LE2, and the third active layer MQW3 of the third light emitting element LE3 may be formed concurrently (e.g., simultaneously) in the same process. In this case, content of indium of each of the first active layer MQW1 of the first light emitting element LE1, the second active layer MQW2 of the second light emitting element LE2, and the third active layer MQW3 of the third light emitting element LE3 may be adjusted by forming a first diameter WE1 of the first light emitting element LE1, a second diameter WE2 of the second light emitting element LE2, and a third diameter WE3 of the third light emitting element LE3 to be different from each other.

In one or more embodiments, diameters of the first light emitting element LE1, the second light emitting element LE2, and the third light emitting element LE3 may be different from each other. For example, the first diameter WE1 of the first light emitting element LE1 may be smaller than the second diameter WE2 of the second light emitting element LE2 and smaller than the third diameter WE3 of the third light emitting element LE3. Also, the second diameter WE2 of the second light emitting element LE2 may be smaller than the third diameter WE3 of the third light emitting element LE3.

Because the first light emitting element LE1 having the smallest diameter from among the first light emitting element LE1, the second light emitting element LE2, and the third light emitting element LE3 has the smallest surface area exposed to the reaction gas during the manufacturing process, the content of indium included in the grown first active layer MQW1 may be the smallest. On the contrary, because the third light emitting element LE3 having the largest diameter from among the first light emitting element LE1, the second light emitting element LE2, and the third light emitting element LE3 has the largest surface area exposed to the reaction gas during the manufacturing process, the content of indium included in the grown third active layer MQW3 may be the greatest.

In one or more embodiments, the first diameter WE1 of the first light emitting element LE1 may be formed to be the smallest, the third diameter WE3 of the third light emitting element LE3 may be formed to be the largest, and the second light emitting element LE2 may be formed to have a size between the first diameter WE1 and the third diameter WE3. Accordingly, the first active layer MQW1 of the first light emitting element LE1 may contain about 10% to 15% of indium to emit first light of blue color, the second active layer MQW2 of the second light emitting element LE2 may contain about 20% to 25% of indium to emit second light of green color, and the third active layer MQW3 of the third light emitting element LE3 may contain about 30% to 45% of indium to emit third light of red color.

That is, the diameter of each of the first light emitting element LE1, the second light emitting element LE2, and the third light emitting element LE3 may be adjusted to adjust the content of indium of the active layers MQW1, MQW2, and MQW3 of each of the light emitting elements LE1, LE2, and LE3. Accordingly, the process may be simplified by forming the light emitting elements LE that emit each of the first light, the second light, and the third light in a single process.

Figure 24:
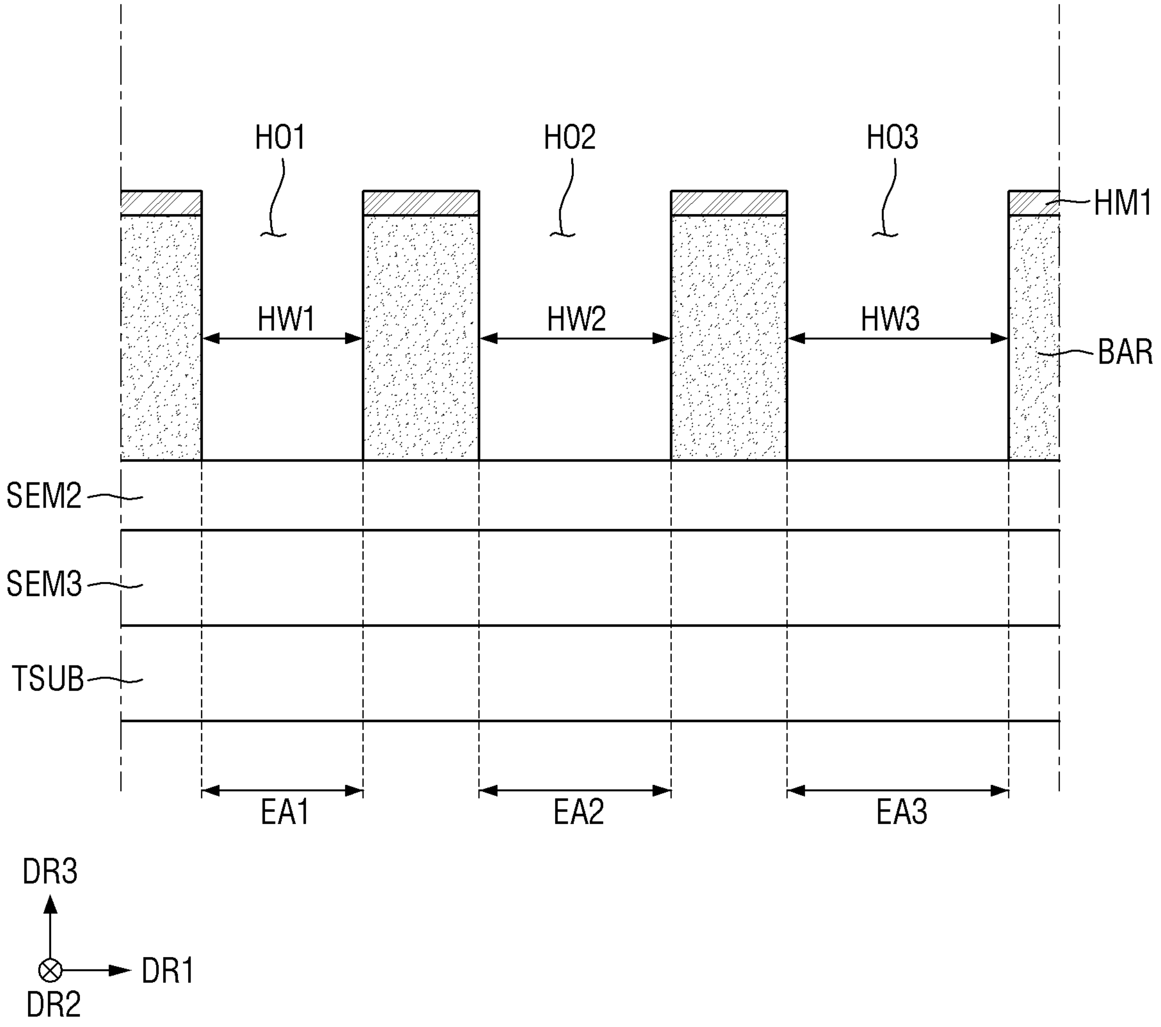
FIGS. 24 and 25 are cross-sectional views for describing a method of manufacturing a display panel of a display device according to one or more embodiments.
Figure 25:
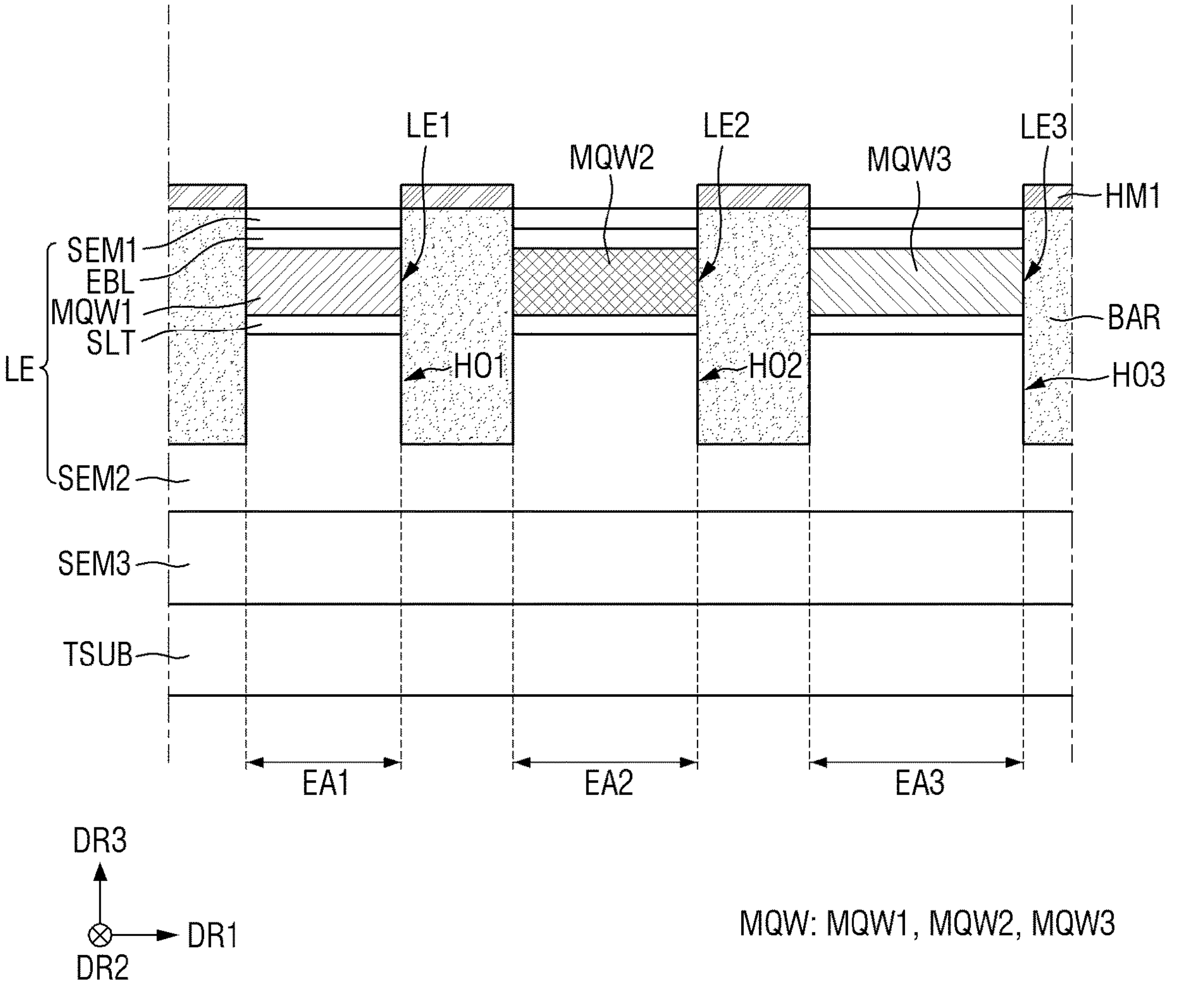

FIGS. 24 and 25 are cross-sectional views for describing a method of manufacturing a display panel of a display device according to one or more embodiments.

The redundant process of the above-described manufacturing method of FIGS. 11 to 21 will be omitted and differences will be mainly shown in FIGS. 24 and 25.

Referring to FIG. 24, the third semiconductor layer SEM3, the second semiconductor layer SEM2, the barrier layer BAR and the hard mask HM1 are formed on the target substrate TSUB through the same process as those of FIGS. 11 to 14 described above. Here, the plurality of openings HO1, HO2, and HO3 formed in the barrier layer BAR are formed to have different diameters. A first opening diameter HW1 of the first opening HO1 may be smaller than a second opening diameter HW2 of the second opening HO2, and the second opening diameter HW2 of the second opening HO2 may be smaller than the third opening diameter HW3 of the third opening HO3.

Next, referring to FIG. 25, the plurality of light emitting elements LE1, LE2, and LE3 are formed in the plurality of openings HO1, HO2, and HO3.

Specifically, the second semiconductor layer SEM2 is further formed on the target substrate TSUB by the above-described epitaxial method. On the semiconductor layer SEM2 exposed by the first opening HO1, the second opening HO2, and the third opening HO3, the second semiconductor layer SEM2 acts as a seed, such that the second semiconductor layer SEM2 is further grown in the first opening HO1, the second opening HO2, and the third opening HO3. Then, the superlattice layer SLT, the active layers MQW1, MQW2, MQW3, the electron blocking layer EBL, and the first semiconductor layer SEM1 are sequentially formed on the second semiconductor layer SEM2 using the above-described epitaxial method to form the first light emitting element LE1, the second light emitting element LE2, and the third light emitting element LE3 at the same time.

The first light emitting element LE1 including the first active layer MQW1 is formed in the first opening HO1, the second light emitting element LE2 including the second active layer MQW2 is formed in the second opening HO2, and the third light emitting element LE3 including the third active layer MQW3 is formed in the third opening HO3, concurrently (e.g., simultaneously).

More specifically, in the first opening HO1 having the smallest diameter, the surface area exposed to the indium reaction gas is the smallest so that the content of indium included in the grown first active layer MQW1 is formed to be the smallest. In the second opening HO2 having a diameter size between that of the first opening HO1 and the third opening HO3, the surface area exposed to the indium reaction gas is formed to be larger than the first opening HO1 and smaller than the third opening HO3 so that the content of indium included in the second active layer MQW2 is formed to be the greater than that of the first active layer MQW1 but smaller than that of the third active layer MQW3. In the third opening HO3 having the largest diameter, the surface area exposed to the indium reaction gas is the largest so that the content of indium included in the grown third active layer MQW3 is formed to be the largest.

In addition, by adjusting the amount of the reaction gas, the first active layer MQW1 of the first light emitting element LE1 is formed to contain about 10% to 15% of indium, the second active layer MQW2 of the second light emitting element LE2 is formed to contain about 20% to 25% of indium, and the third active layer MQW3 of the third light emitting element LE3 is formed to contain about 30% to 45% of indium.

That is, the indium content of the active layers MQW1, MQW2, and MQW3 of each of the light emitting elements LE1, LE2, and LE3 is adjusted by adjusting the size of the opening diameters of the plurality of openings HO1, HO2, HO3 of the barrier layer BAR. Accordingly, the process can be simplified by forming the light emitting elements LE that emit each of the first light, the second light, and the third light in a single process.

FIGS. 26 to 30 are detailed layout views illustrating one or more examples of the area A of FIG. 1. FIG. 31 is a cross-sectional view illustrating an example of a display panel taken along the line D-D' of FIG. 26.

Figure 26:
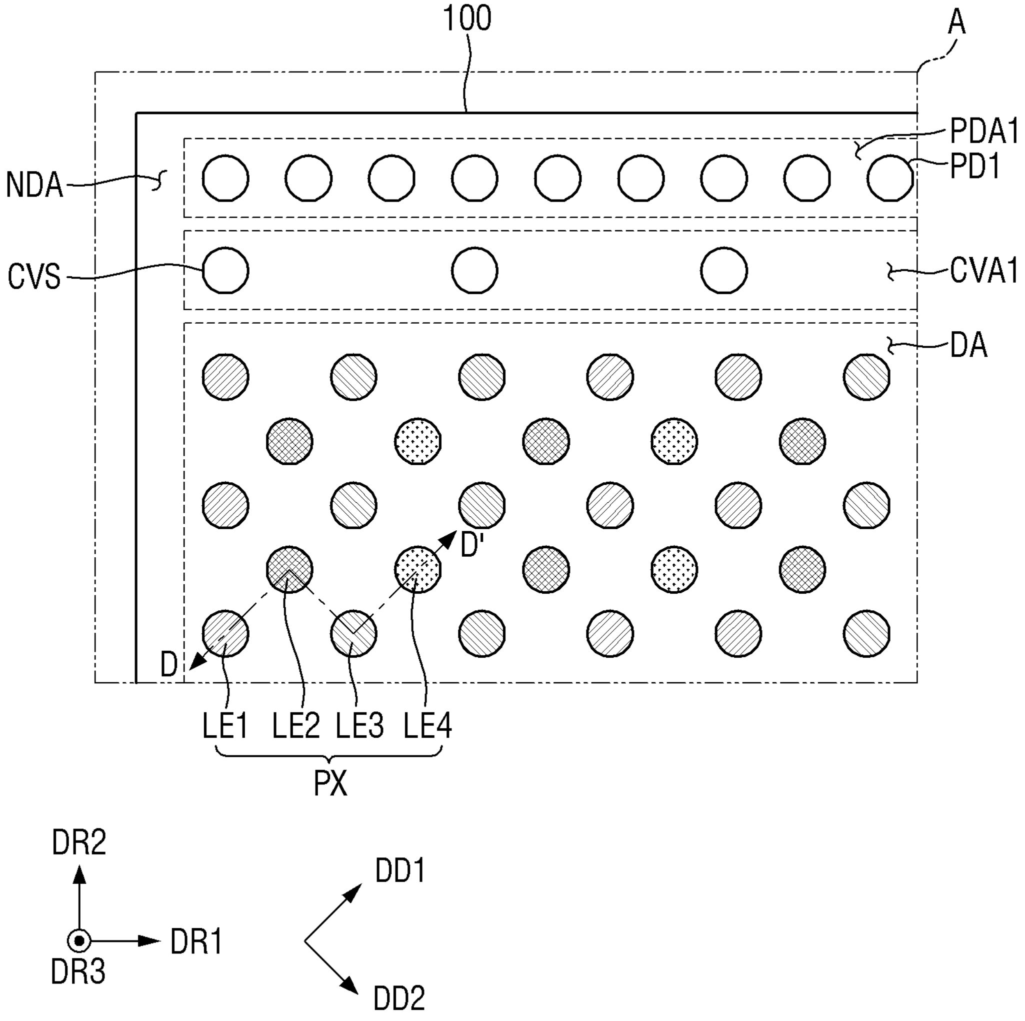
FIGS. 26 to 30 are layout diagrams illustrating another example of the region A of FIG. 1 in detail.

Referring to FIGS. 26 and 31, the embodiment of FIGS. 26 to 31 is different from the embodiment of FIGS. 2 and 3 in further including a fourth light emitting element LE4 emitting the same second light as the second light emitting element LE2 and that each of the light emitting areas EA1, EA2, EA3, and EA4 are arranged in a PENTILE® arrangement structure, or the like, but the present disclosure is not limited thereto and various embodiments known in the art may be applied. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. Hereinafter, the description duplicated with the embodiment of FIGS. 2 and 3 will be omitted.

Referring to FIGS. 26 to 31, each of the plurality of pixels PX may include a first light emitting element LE1 for emitting the first light, a second light emitting element LE2 for emitting the second light, a third light emitting element LE3 for emitting the first light, and a fourth light emitting element LE4 for emitting the second light.

In the display area DA, the first light emitting elements LE1 and the third light emitting elements LE3 may be alternately arranged along the first direction DR1. The second light emitting elements LE2 and the fourth light emitting elements LE4 may be alternately arranged along the first direction DR1. The first light emitting elements LE1, the second light emitting elements LE2, the third light emitting elements LE3 and the fourth light emitting elements LE4 may be alternately arranged along a first diagonal direction DD1 and a second diagonal direction DD2. The first diagonal direction DD1 may be a diagonal direction of the first direction DR1 and the second direction DR2, and the second diagonal direction DD2 may be a direction orthogonal to the first diagonal direction DD1.

In each of the plurality of pixels PX, the first light emitting element LE1 and the third light-emitting element LE3 may be arranged along the first direction DR1, and the second light emitting element LE2 and the fourth light emitting element LE4 may be arranged along the first direction DR1. In each of the plurality of pixels PX, the first light emitting element LE1 and the second light emitting element LE2 may be arranged along the first diagonal direction DD1, the second light emitting element LE2 and the third light emitting element LE3 may be arranged along the second diagonal direction DD2, and the third light emitting element LE3 and the fourth light emitting element LE4 may be arranged along the first diagonal direction DD1.

The fourth light emitting element LE4 may substantially be the same as the second light emitting element LE2. That is, the fourth light emitting element LE4 may emit the second light, and may have the same structure as that of the second light emitting element LE2.

The first light emitting element LE1 may be disposed in the first emission area EA1, the second light emitting element LE2 may be disposed in the second emission area EA2, the third light emitting element LE3 may be disposed in the third emission area EA3, and the fourth light emitting element LE4 may be disposed in a fourth emission area EA4.

A size of the first emission area EA1, a size of the second emission area EA2, a size of the third emission area EA3, and a size of the fourth emission area EA4 may substantially be the same as each other, but embodiments of the present disclosure are not limited thereto. For example, the size of the first emission area EA1, the size of the second emission area EA2, and the size of the third emission area EA3 may be different from one another, and the size of the second emission area EA2 may be the same as that of the fourth emission area EA4.

A distance between the first and second emission areas EA1 and EA2 adjacent to each other, a distance between the second and third emission areas EA2 and EA3 adjacent to each other, a distance between the first and fourth emission areas EA1 and EA4 adjacent to each other, and a distance between the third and fourth emission areas EA3 and EA4 adjacent to each other may be substantially the same as one another, but embodiments of the present disclosure are not limited thereto. For example, the distance between the first and second emission areas EA1 and EA2 adjacent to each other and the distance between the second and third emission areas EA2 and EA3 adjacent to each other may be different from each other, and the distance between the first and fourth emission areas EA1 and EA4 adjacent to each other and the distance between the third and fourth emission areas EA3 and EA4 adjacent to each other may be different from each other. In this case, the distance between the first and second emission areas EA1 and EA2 adjacent to each other and the distance between the first and fourth emission areas EA1 and EA4 adjacent to each other may be substantially the same as each other, and the distance between the second and third emission areas EA2 and EA3 adjacent to each other and the distance between the third and fourth emission areas EA3 and EA4 adjacent to each other may be substantially the same as each other.

Figure 27:
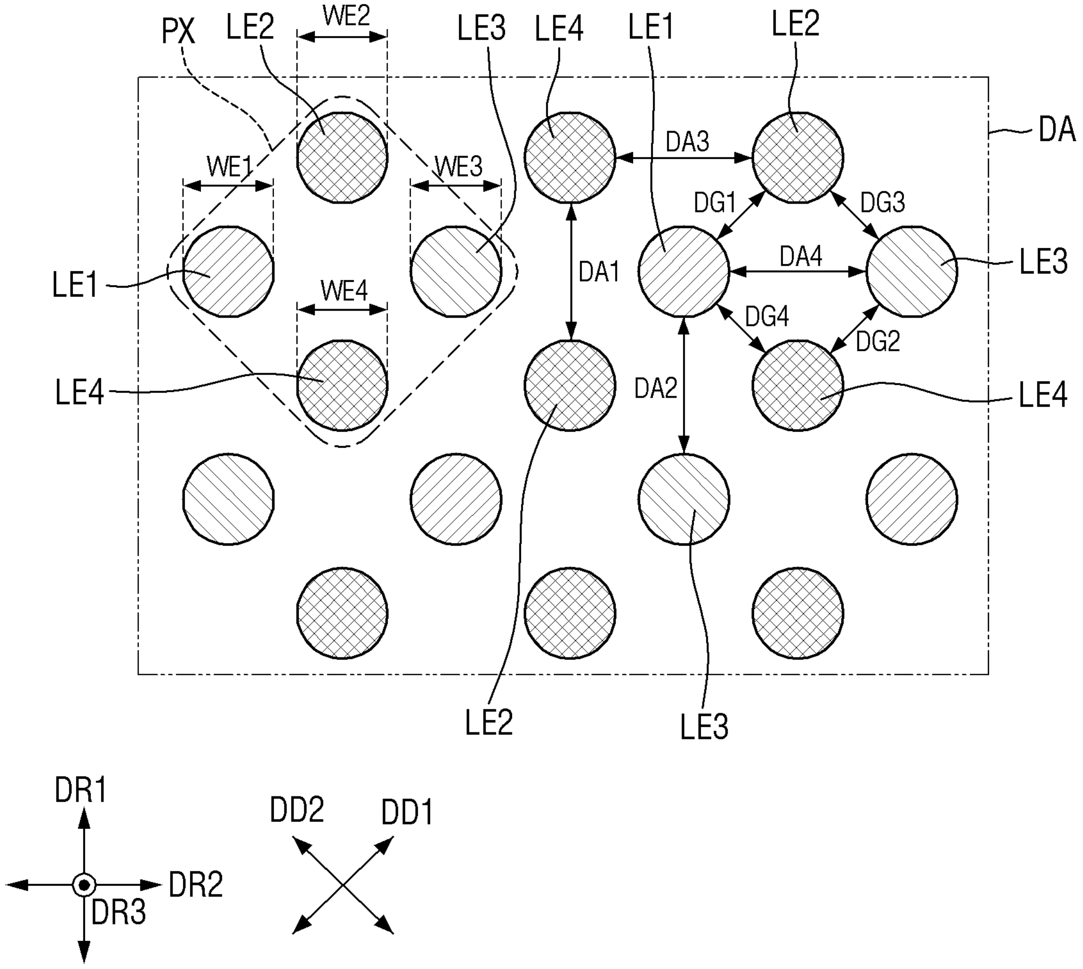

Referring to FIG. 27, in a display device 10 according to one or more embodiments, each of the plurality of pixels PX may include four light-emitting elements LE1, LE2, LE3 and LE4, wherein the plurality of light-emitting elements LE1, LE2, LE3 and LE4 are spaced from one another in the first direction DR1 and the second direction DR2, and the elements most adjacent to each other may be spaced from each other in the diagonal directions DD1 and DD2 between the first direction DR1 and the second direction DR2.

In one or more embodiments, the first light emitting element LE1, the second light emitting element LE2, the third light emitting element LE3 and the fourth light emitting element LE4 may have the same diameter. For example, a first diameter WE1 of the first light emitting element LE1, a second diameter WE2 of the second light emitting element LE2, a third diameter WE3 of the third light emitting element LE3 and a fourth diameter WE4 of the fourth light emitting element LE4 may be the same as one another, but the present disclosure is not limited thereto. In one or more embodiments, the diameters of the light emitting elements LE1, LE2, LE3 and LE4 may be different from one another.

Distances DA1 and DA3 between the second and fourth light-emitting elements LE2 and LE4 adjacent to each other may be the same as distances DA2 and DA4 between the first and third light-emitting elements LE1 and LE3 adjacent to each other. For example, the first distance DA1 between the second and fourth light emitting elements LE2 and LE4 adjacent to each other in the first direction DR1 may be the same as the second distance DA2 between the first and third light emitting elements LE1 and LE3 adjacent to each other in the first direction DR1. The third distance DA3 between the second and fourth light emitting elements LE2 and LE4 adjacent to each other in the second direction DR2 may be the same as the fourth distance DA4 between the first and third light emitting elements LE1 and LE3 adjacent to each other in the second direction DR2. Also, a first diagonal distance DG1 between the first and second light emitting elements LE1 and LE2 adjacent to each other in the first diagonal direction DD1 may be the same as a second diagonal distance DG2 between the third and fourth light emitting elements LE3 and LE4 adjacent to each other in the first diagonal direction DD1. A third diagonal distance DG3 between the second and third light emitting elements LE2 and LE3 adjacent to each other in the second diagonal direction DD2 may be the same as a fourth diagonal distance DG4 between the first and fourth light emitting elements LE1 and LE4 adjacent to each other in the second diagonal direction DD2, but the present disclosure is not limited thereto. In one or more embodiments, the diameters of the light emitting elements LE1, LE2, LE3 and LE4 may be different from one another. The distance between the light emitting elements LE adjacent to each other may vary depending on the arrangement, diameter, etc. of the light emitting elements LE.

In FIG. 27, the distances DA1 to DA4 and DG1 to DG4 from among the first to fourth light emitting elements LE1, LE2, LE3 and LE4 are illustrated based on an outer portion of each of the light emitting elements LE1, LE2, LE3 and LE4, but the present disclosure is not limited thereto. The distances DA1 to DA4 and DG1 to DG4 from among the first to fourth light emitting elements LE1, LE2, LE3, and LE4 may be shown based on the center of the light emitting elements LE1, LE2, LE3, and LE4.

Figure 28:
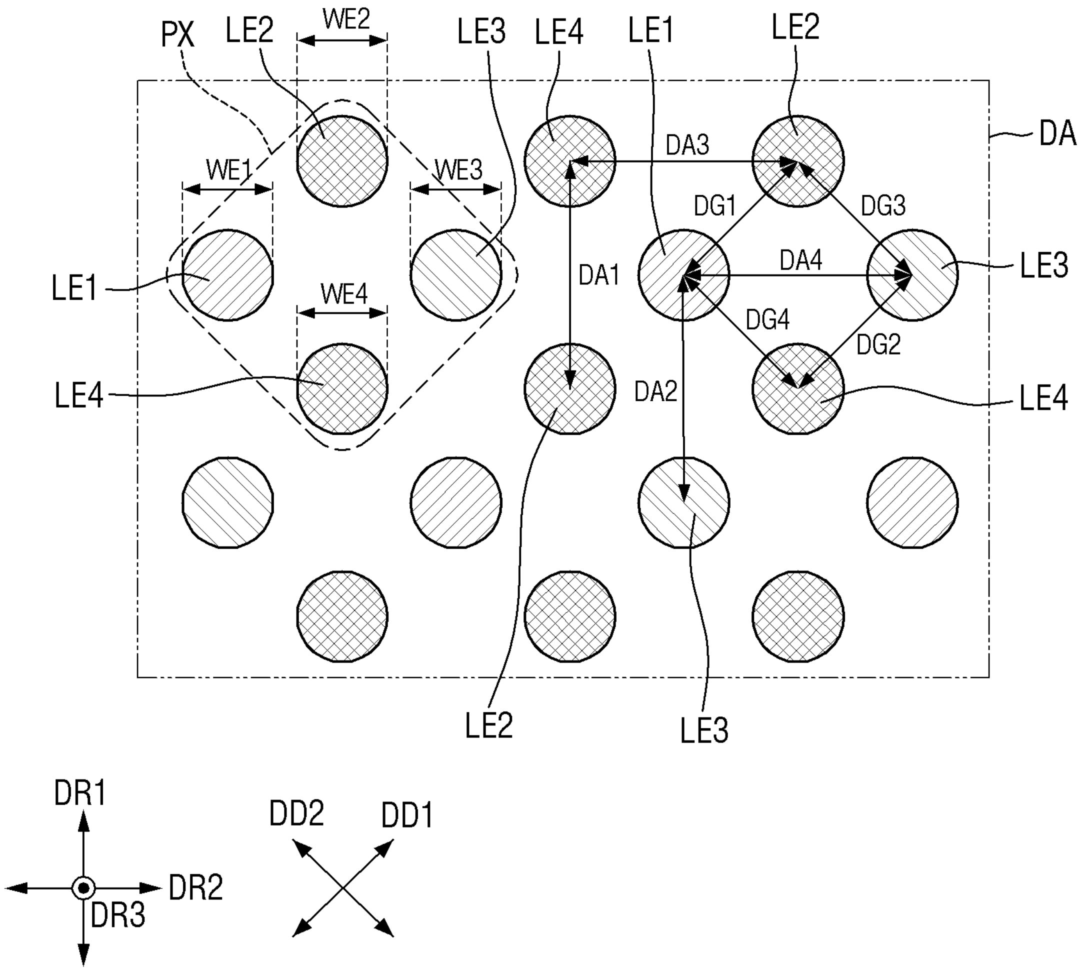

Referring to FIG. 28, the distances DA1 and DA3 between the center of the second light emitting element LE2 and the center of the fourth light emitting element LE4, which are adjacent to each other, may be the same as the distances DA2 and DA4 between the center of the first light emitting element LE1 and the center of the third light emitting element LE3, which are adjacent to each other. For example, the first distance DA1 between the center of the second light emitting element LE2 and the center of the fourth light emitting element LE4, which are adjacent to each other in the first direction DR1, may be the same as the second distance DA2 between the center of the first light emitting element LE1 and the center of the third light emitting element LE3, which are adjacent to each other in the first direction DR1. The third distance DA3 between the center of the second light emitting element LE2 and the center of the fourth light emitting element LE4, which are adjacent to each other in the second direction DR2, may be the same as the fourth distance DA4 between the center of the first light emitting element LE1 and the center of the third light emitting element LE3, which are adjacent to each other in the second direction DR2. Also, the first diagonal distance DG1 between the center of the first light emitting element LE1 and the center of the second light emitting element LE2, which are adjacent to each other in the first diagonal direction DD1, may be the same as the second diagonal distance DG2 between the center of the third light emitting element LE3 and the center of the fourth light emitting element LE4, which are adjacent to each other in the first diagonal direction DD1. The third diagonal distance DG3 between the center of the second light emitting element LE2 and the center of the third light emitting element LE3, which are adjacent to each other in the second diagonal direction DD2, may be the same as the fourth diagonal distance DG4 between the center of the first light emitting element LE1 and the center of the fourth light emitting element LE4, which are adjacent to each other in the second diagonal direction DD2.

In the present embodiment, the distances DA1 to DA4 and DG1 to DG4 between the centers of the light emitting elements LE1, LE2, LE3, and LE4 may be the same as one another, but are not limited thereto. The distances between the centers of the light emitting elements LE1, LE2, LE3, and LE4 may be modified similarly to those described above with reference to the embodiment of FIG. 27.

Figure 29:
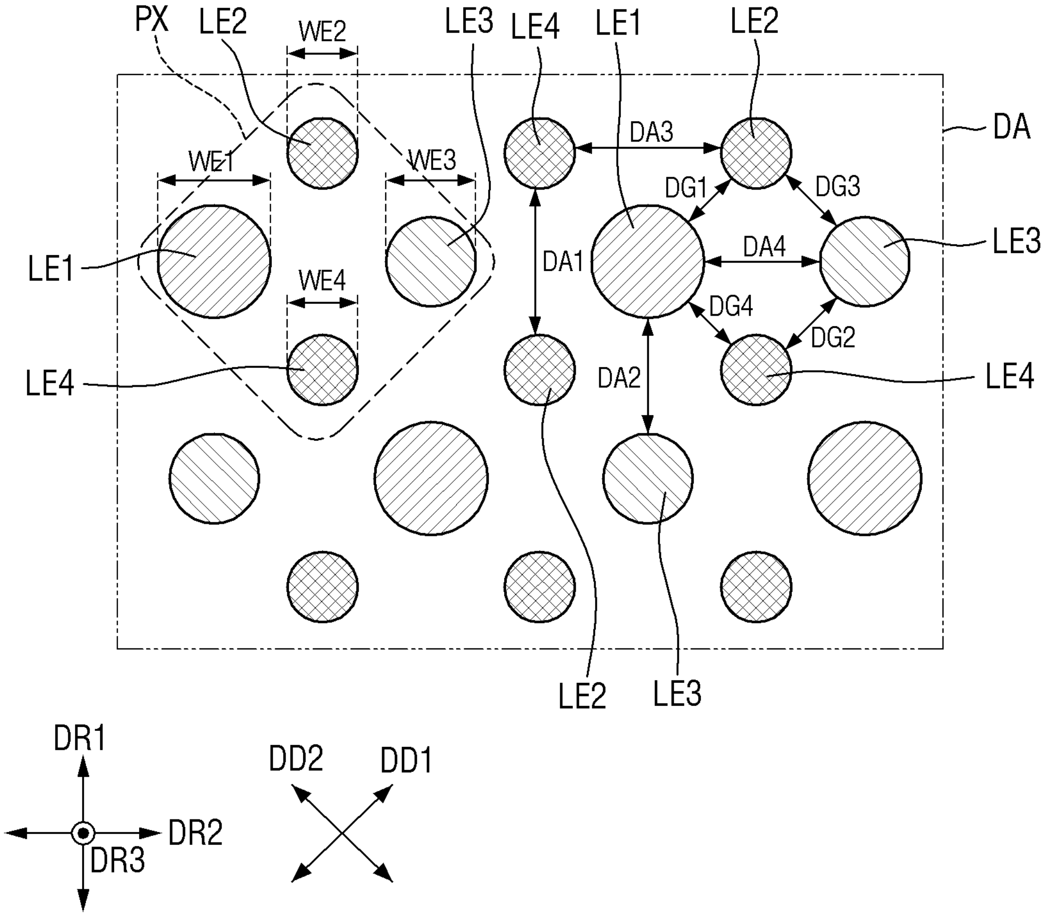
Figure 30:
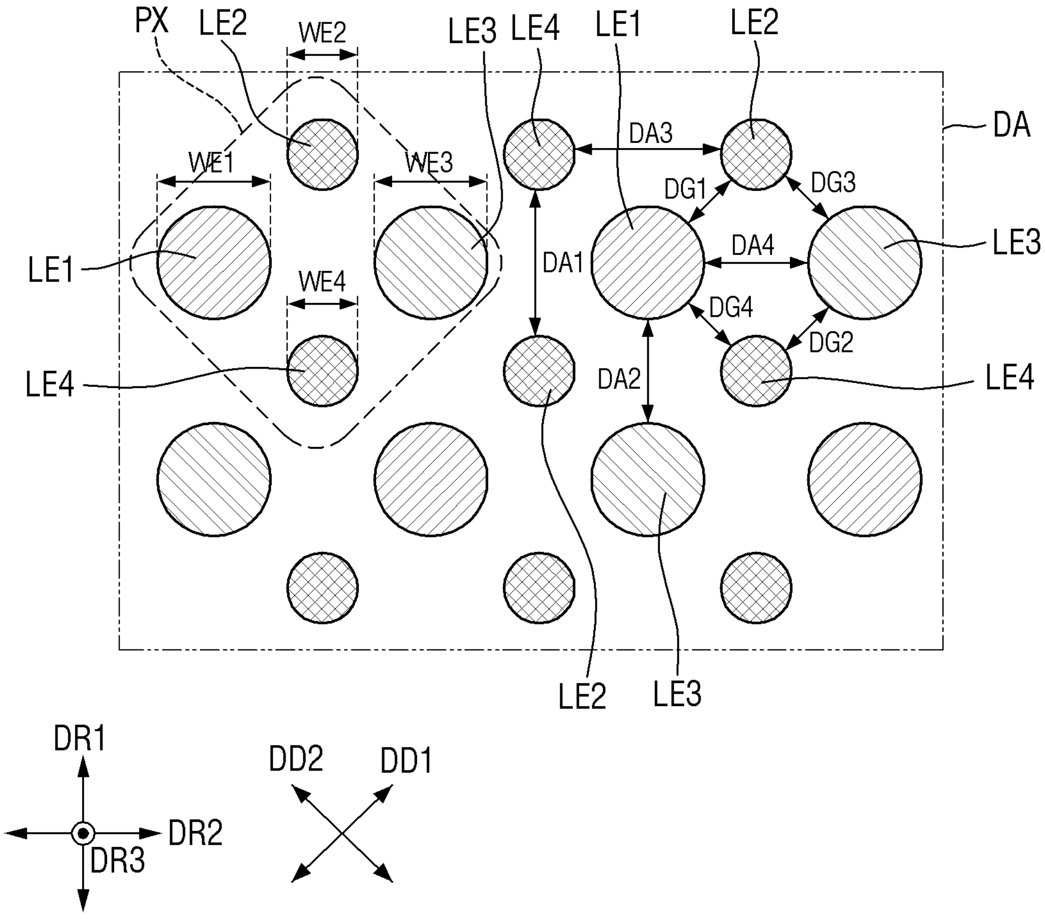
Figure 31:
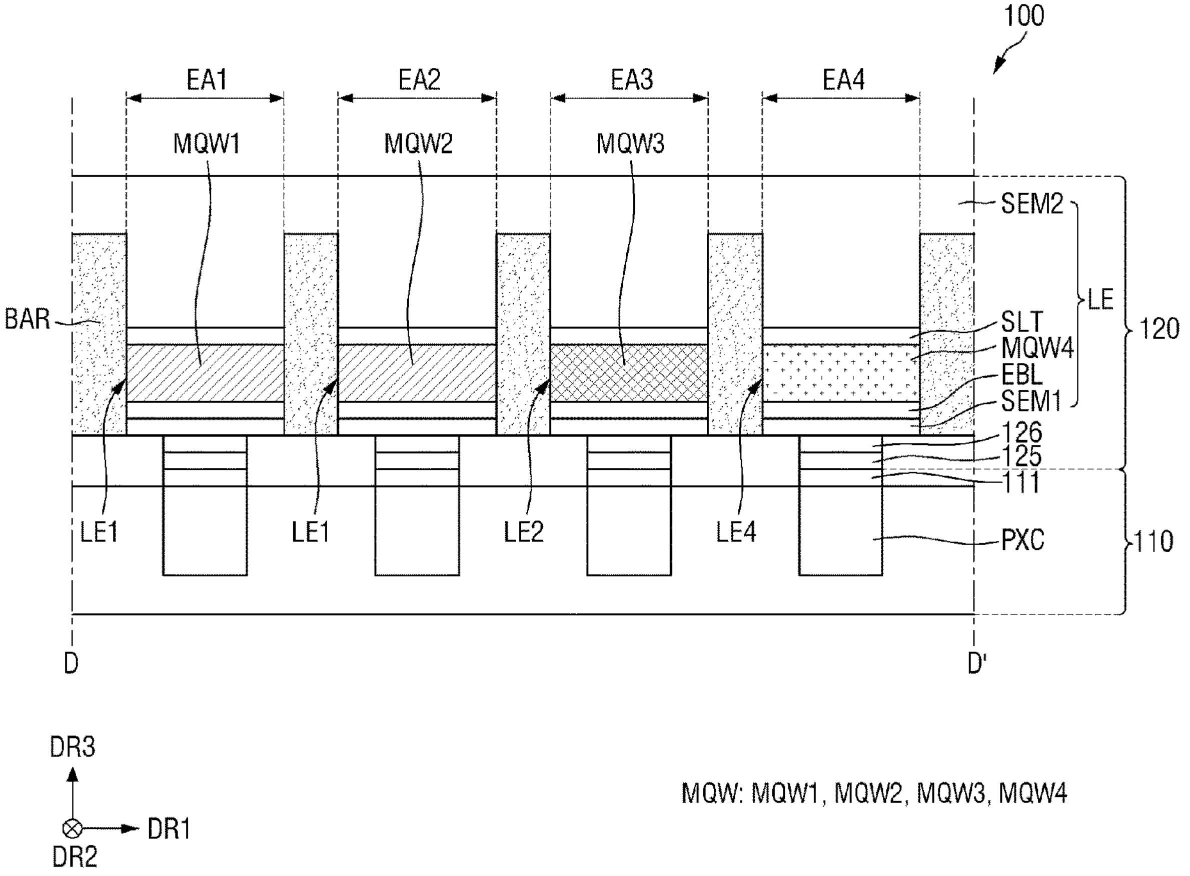
FIG. 31 is a cross-sectional view illustrating an example of the display panel taken along the line D-D' of FIG. 26.

Referring to FIGS. 29 and 30, in the display device according to one or more embodiments of the present disclosure, the light emitting elements LE1, LE2, LE3, and LE4 may have their respective sizes different from each other. In the embodiment of FIG. 29, the first diameter WE1 of the first light emitting element LE1 may be greater than the diameters WE2, WE3, and WE4 of the second light emitting element LE2, the third light emitting element LE3, and the fourth light emitting element LE4, and the third diameter WE3 of the third light emitting element LE3 may be greater than the diameters WE2 and WE4 of the second light emitting element LE2 and the fourth light emitting element LE4. The second diameter WE2 of the second light emitting element LE2 may be the same as the fourth diameter WE4 of the fourth light emitting element LE4. The embodiment of FIG. 29 differs from the embodiment of FIG. 30 in that the first diameter WE1 of the first light emitting element LE1 is the same as the third diameter WE3 of the third light emitting element LE3.

In one or more embodiments, the distances between the adjacent light-emitting elements LE may partially be different from one another. For example, the first distance DA1 between the second light emitting element LE2 and the fourth light emitting element LE4, which are adjacent to each other in the first direction DR1, may be greater than the second distance DA2 between the first light emitting element LE1 and the third light emitting element LE3, which are adjacent to each other in the first direction DR1. The third distance DA3 between the second light emitting element LE2 and the fourth light-emitting element LE4, which are adjacent to each other in the second direction DR2, may be greater than the fourth distance DA4 between the first light emitting element LE1 and the third light emitting element LE3, which are adjacent to each other in the second direction DR2. Also, the first diagonal distance DG1 between the first light emitting element LE1 and the second light emitting element LE2, which are adjacent to each other in the first diagonal direction DD1, may be different from the second diagonal distance DG2 between the third light emitting element LE3 and the fourth light emitting element LE4, which are adjacent to each other in the first diagonal direction DD1. The third diagonal distance DG3 between the second light emitting element LE2 and the third light emitting element LE3, which are adjacent to each other in the second diagonal direction DD2, may be different from the fourth diagonal distance DG4 between the first light emitting element LE1 and the fourth light emitting element LE4, which are adjacent to each other in the second diagonal direction DD2.

In the embodiment in which the first diameter WE1 of the first light-emitting element LE1 is greater than the third diameter WE3 of the third light emitting element LE3, the first diagonal distance DG1 may be smaller than the second diagonal distance DG2, and the third diagonal distance DG3 may be greater than the fourth diagonal distance DG4, but the present disclosure is not limited thereto. The distances between the light emitting elements LE adjacent to each other may vary depending on the arrangement, diameter, etc. of the light emitting elements LE. For example, in the embodiment in which the first diameter WE1 of the first light emitting element LE1 is the same as the third diameter WE3 of the third light emitting element LE3, the first diagonal distance DG1 may be the same as the second diagonal distance DG2, and the third diagonal distance DG3 may be the same as the fourth diagonal distance DG4.

Also, although FIGS. 29 and 30 illustrate the distances based on the outer portion of the light emitting elements LE1, LE2, LE3, and LE4 as the distances DA1 to DA4 and DG1 to DG4 between the light emitting elements LE1, LE2, LE3, and LE4, the present disclosure is not limited thereto. Similar to the embodiment of FIG. 28, the distances between the light emitting elements LE1, LE2, LE3, and LE4 described in FIGS. 29 and 30 may equally be applied even though the distances between the light emitting elements LE1, LE2, LE3, and LE4 are compared with one another based on the centers of the light emitting elements LE1, LE2, LE3, and LE4. However, in the embodiment in which the diameters of the light emitting elements LE1, LE2, LE3, and LE4 are different from one another, the distances based on the outer portion of the light emitting elements LE1, LE2, LE3, and LE4 may be different from the distances based on the centers of the light emitting elements LE1, LE2, LE3, and LE4 in sizes.

In addition, the first light emitting area EA1 may emit the first light, the second light emitting area EA2 and the fourth light emitting area EA4 may emit the second light, and the third light emitting area EA3 may emit the third light, but embodiments of the present disclosure is not limited thereto. For example, the first light emitting area EA1 may emit the first light, the second light emitting area EA2 and the fourth light emitting area EA4 may emit the third light, and the third light emitting area EA3 may emit the second light. Alternatively, the first light emitting area EA1 may emit the second light, the second light emitting EA2 and the fourth light emitting EA4 may emit the first light, and the third light emitting area EA3 may emit the third light.

In addition, the first emission area EA1, the second emission area EA2, the third emission area EA3, and the fourth emission area EA4 may have a circular planar shape, but embodiments of the present disclosure are not limited thereto. For example, the first emission area EA1, the second emission area EA2, the third emission area EA3, and the fourth emission area EA4 may have a polygonal shape such as a triangle shape, a quadrilateral shape, a pentagonal shape, a hexagonal shape, and an octagonal shape, an elliptical shape, or an irregular shape.

Figure 32:
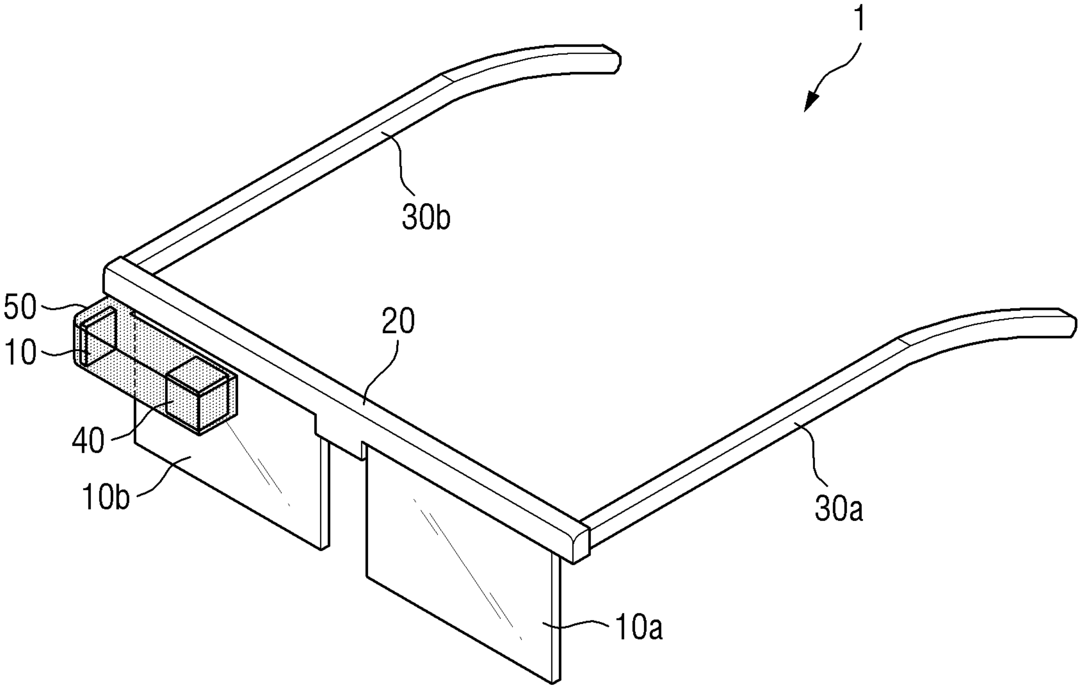
FIG. 32 is an illustrative view illustrating a virtual reality device including a display device according to one or more embodiments.

FIG. 32 is a diagram illustrating a virtual reality device including a display device according to one or more embodiments. FIG. 32 illustrates a virtual reality device 1 to which a display device 10 according to one or more embodiments is applied.

Referring to FIG. 32, the virtual reality device 1 according to one or more embodiments may be a glass-type device. The virtual reality device 1 according to one or more embodiments may include the display device 10, a left lens 10*a*, a right lens 10*b*, a support frame 20, temples 30*a* and 30*b*, a reflection member 40, and a display device storage 50.

Although FIG. 32 illustrates the virtual reality device 1 including the temples 30*a* and 30*b*, the virtual reality device 1 according to one or more embodiments may be applied to a head mounted display including a head mounted band that may be worn on a head, instead of the temples 30*a* and 30*b*. That is, the virtual reality device 1 according to one or more embodiments is not limited to that shown in FIG. 32, and may be applied in various forms to various electronic devices.

The display device storage 50 may include the display device 10 and the reflection member 40. The image displayed on the display device 10 may be reflected by the reflection member 40 and provided to a user's right eye through the right lens 10*b*. Accordingly, the user can view the virtual reality image displayed on the display device 10 through the right eye.

FIG. 32 illustrates that the display device storage 50 is disposed at the end on the right side of the support frame 20, but embodiments of the present disclosure are not limited thereto. For example, the display device storage 50 may be disposed at the left end of the support frame 20, and in this case, the image displayed on the display device 10 may be reflected by the reflection member 40 and provided to a user's left eye through the left lens 10*a*. Accordingly, the user can view the virtual reality image displayed on the display device 10 through the left eye. Alternatively, the display device storage 50 may be disposed at both the left end and the right end of the support frame 20. In that case, the user can view the virtual reality image displayed on the display device 10 through both the left eye and the right eye.

Figure 33:
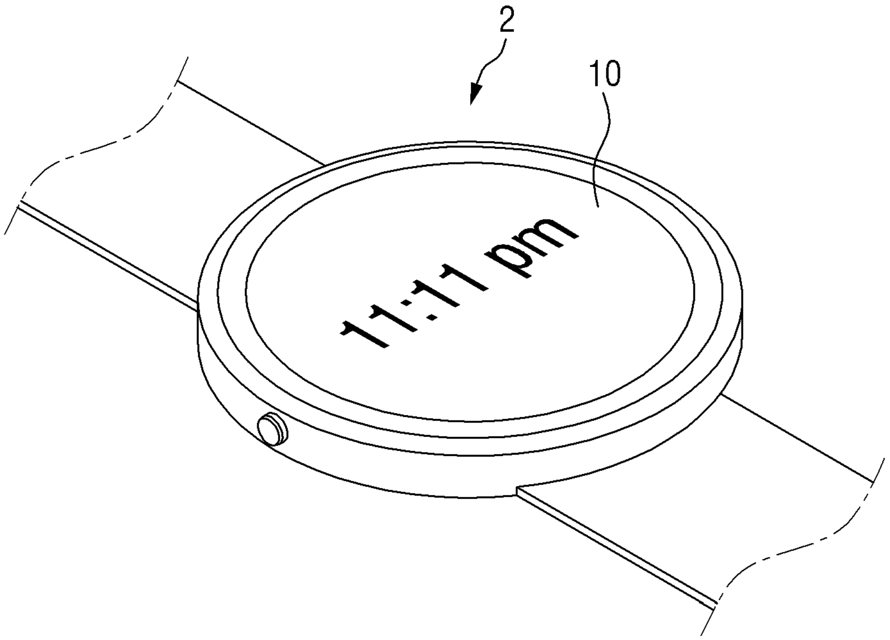
FIG. 33 is an illustrative view illustrating a smart device including a display device according to one or more embodiments.

FIG. 33 is a diagram illustrating a smart device including a display device according to one or more embodiments.

Referring to FIG. 33, a display device 10 according to one or more embodiments may be applied to a smart watch 2 that is one of the smart devices.

Figure 34:
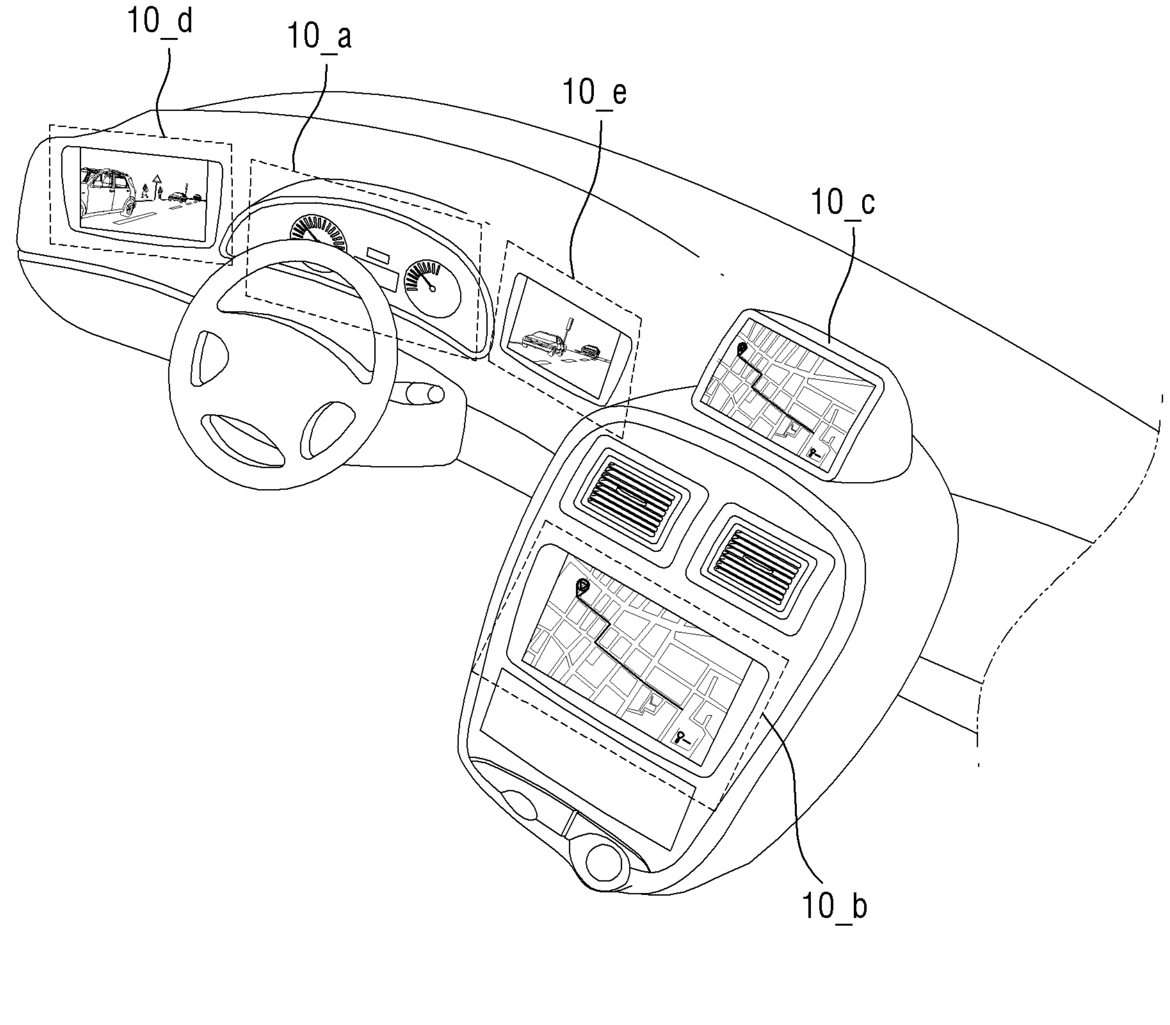
FIG. 34 is an illustrative view illustrating a vehicle including a display device according to one or more embodiments.

FIG. 34 is an illustrative view illustrating a vehicle including a display device according to one or more embodiments. FIG. 34 illustrates a vehicle to which display device 10 according to one or more embodiments is applied.

Referring to FIG. 34, the display devices 10_*a*, 10_*b*, and 10_*c* according to one or more embodiments may be applied to the dashboard of the automobile, the center fascia of the automobile, or the center information display (CID) of the dashboard of the automobile. Further, the display devices 10_*d*, and 10_*e* according to one or more embodiments may be applied to a room mirror display instead of side mirrors of the automobile.

Figure 35:
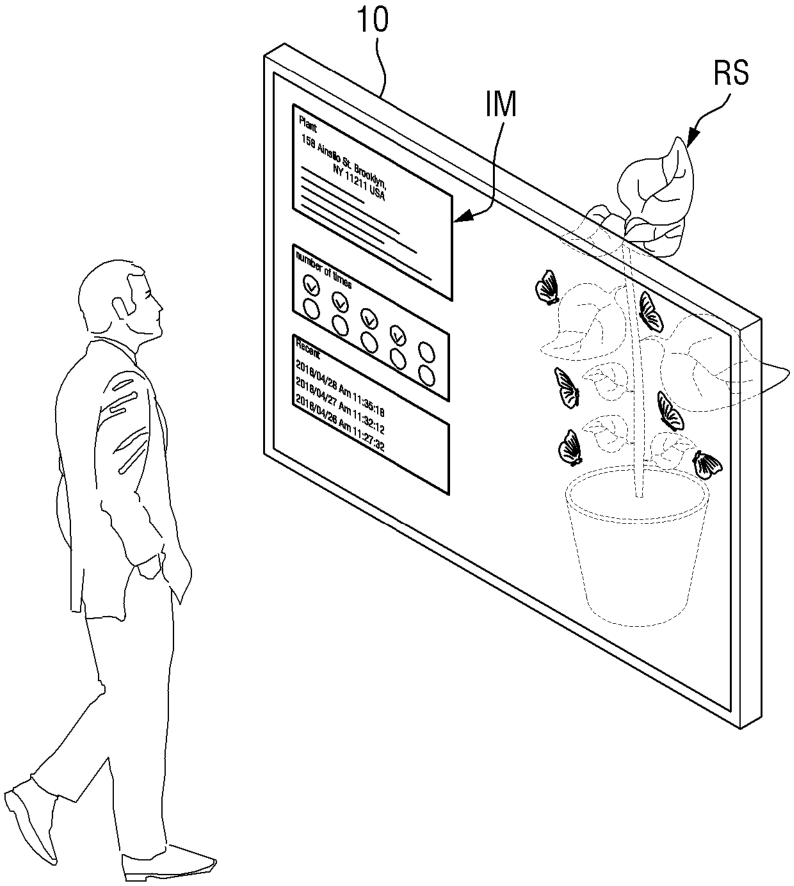
FIG. 35 is an illustrative view illustrating a transparent display device including a display device according to one or more embodiments.

FIG. 35 is an illustrative view illustrating a transparent display device including a display device according to one or more embodiments.

Referring to FIG. 35, the display device 10 according to one or more embodiments may be applied to the transparent display device. The transparent display device may display an image IM, and also may transmit light. Therefore, a user located on the front side of the transparent display device can view an object RS or a background on the rear side of the transparent display device as well as the image IM displayed on the display device 10. When the display device 10 is applied to the transparent display device, the semiconductor circuit substrate 110 of the display device 10 may include a light transmitting portion capable of transmitting light or may be made of a material capable of transmitting light.

In concluding the detailed description, those skilled in the art will appreciate that many variations and modifications can be made to the embodiments without substantially departing from the principles and scope of the present disclosure. Therefore, the described embodiments of the present disclosure are used in a generic and descriptive sense only and not for purposes of limitation.

What is claimed is:

1. A display device comprising:
- a substrate;
- a plurality of pixel electrodes on the substrate;
- a plurality of light emitting elements on the plurality of pixel electrodes, each of the plurality of light emitting elements comprising a first semiconductor layer, an active layer, and a second semiconductor layer, and
- a barrier layer around the plurality of light emitting elements and partitioning the plurality of light emitting elements,
- wherein the barrier layer comprises a semiconductor material and a dopant comprising iron or carbon,
- wherein the plurality of light emitting elements comprises a first light emitting element configured to emit light of a blue wavelength band, a second light emitting element configured to emit light of a green wavelength band, and a third light emitting element configured to emit light of a red wavelength band, and
- wherein a diameter of the first light emitting element is smaller than a diameter of the second light emitting element and the diameter of the second light emitting element is smaller than a diameter of the third light emitting element.

2. The display device of claim 1, wherein the semiconductor material of the barrier layer comprises AlGaInN, GaN, AlGaN, InGaN, AlN or InN.

3. The display device of claim 1, wherein a doping concentration of the dopant is in a range of 1×1017 to 1×1020/cm3.

4. The display device of claim 1, wherein the second semiconductor layer is a common layer continuously on the plurality of light emitting elements.

5. The display device of claim 4, wherein the barrier layer is on a second semiconductor region not overlapping the first semiconductor layer and the active layer.

6. The display device of claim 1, wherein a length of the barrier layer is between 0.1 μm to 10 μm.

7. The display device of claim 1, wherein one surface of the barrier layer aligns and coincides with one surface of the first semiconductor layer.

8. The display device of claim 1, wherein the barrier layer is in contact with a portion of the second semiconductor layer, the first semiconductor layer, and a side surface of the active layer of each of the plurality of light emitting elements.

9. The display device of claim 1, wherein the active layer of the first light emitting element, the active layer of the second light emitting element, and the active layer of the third light emitting element comprise different amount of indium doped into a semiconductor material.

10. A method of a display device, the method comprising:
- forming a third semiconductor layer and a second semiconductor layer on a target substrate;
- forming a first insulating member on the second semiconductor layer and forming a barrier layer from the second semiconductor layer;
- forming a plurality of openings by removing the first insulating member using a hard mask;
- forming light emitting elements in the plurality of openings; and
- bonding the light emitting elements to a semiconductor circuit board,
- wherein the barrier layer is grown from the second semiconductor layer and is formed by doping iron or carbon as a dopant, and
- wherein the barrier layer has a same length as the first insulating layer.

11. The method of claim 10, wherein the barrier layer is grown as the second semiconductor layer acts as seed, and the dopant is applied by flowing a reactive gas containing iron or carbon.

12. The method of claim 10, wherein a doping concentration of the dopant is formed in a range of 1×1017/cm3 to 1×1020/cm3.

13. The method of claim 10, wherein the forming of the light emitting elements comprises:
- forming a second insulating member having a first opening from among the plurality of openings exposed;
- forming a first light emitting element in the first opening;
- forming a third insulating member having a second opening from among the plurality of openings exposed;
- forming a second light emitting element in the second opening;
- forming a fourth insulating member having a third opening from among the plurality of openings exposed;
- forming a third light emitting element in the third opening; and
- removing the second insulating member, the third insulating member, and the fourth insulating member.

14. The method of claim 10, further comprising forming a connection electrode on the light emitting elements after forming the light emitting elements.

15. The method of claim 14, wherein the light emitting elements are bonded to the semiconductor circuit board by a fusion bonding of a pixel electrode formed on the semiconductor circuit board and the connection electrode.

16. The method of claim 10, further comprising removing the target substrate and the third semiconductor layer after bonding the light emitting elements to the semiconductor circuit board,
- wherein the target substrate and the third semiconductor layer are removed by using a laser lift off, polishing, or etching process.

17. An electronic device comprising;
- a substrate;
- a plurality of pixel electrodes on the substrate;
- a plurality of light emitting elements on the plurality of pixel electrodes, each of the plurality of light emitting elements comprising a first semiconductor layer, an active layer, and a second semiconductor layer, and
- a barrier layer around the plurality of light emitting elements and partitioning the plurality of light emitting elements,
- wherein the barrier layer comprises a semiconductor material same as a semiconductor material of the second semiconductor layer, the semiconductor material of the barrier layer having a different dopant from the semiconductor material of the second semiconductor layer, wherein the dopant comprises iron or carbon, wherein the plurality of light emitting elements comprises a first light emitting element configured to emit light of a blue wavelength band, a second light emitting element configured to emit light of a green wavelength band, and a third light emitting element configured to emit light of a red wavelength band, and wherein a diameter of the first light emitting element is smaller than a diameter of the second light emitting element and the diameter of the second light emitting element is smaller than a diameter of the third light emitting element.

* * * * *